US009287145B2

(12) United States Patent
Nakaharada et al.

(10) Patent No.: US 9,287,145 B2
(45) Date of Patent: Mar. 15, 2016

(54) SUBSTRATE TREATMENT SYSTEM, SUBSTRATE TRANSFER METHOD, AND A NON-TRANSITORY COMPUTER STORAGE MEDIUM

(71) Applicant: Tokyo Electron Limited, Tokyo (JP)

(72) Inventors: Masahiro Nakaharada, Koshi (JP); Yoji Sakata, Koshi (JP); Akira Miyata, Koshi (JP); Shinichi Hayashi, Koshi (JP); Suguru Enokida, Koshi (JP); Tsunenaga Nakashima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 534 days.

(21) Appl. No.: 13/663,179

(22) Filed: Oct. 29, 2012

(65) Prior Publication Data

US 2013/0112223 A1      May 9, 2013

(30) Foreign Application Priority Data

Nov. 4, 2011 (JP) .................................. 2011-242331
Nov. 4, 2011 (JP) .................................. 2011-242336

(51) Int. Cl.
| | | |
|---|---|---|
| H01L 21/67 | (2006.01) | |
| H01L 21/677 | (2006.01) | |
| H01L 21/687 | (2006.01) | |

(52) U.S. Cl.
CPC ...... *H01L 21/67046* (2013.01); *H01L 21/6719* (2013.01); *H01L 21/67173* (2013.01); *H01L 21/67178* (2013.01); *H01L 21/67213* (2013.01); *H01L 21/67253* (2013.01); *H01L 21/67748* (2013.01); *H01L 21/6875* (2013.01)

(58) Field of Classification Search
None
See application file for complete search history.

(56) References Cited

U.S. PATENT DOCUMENTS

| | | | | |
|---|---|---|---|---|
| 2008/0142043 | A1* | 6/2008 | Yamamoto et al. | ............. 134/18 |
| 2010/0132742 | A1* | 6/2010 | Tomita et al. | .................. 134/18 |

FOREIGN PATENT DOCUMENTS

| | | | |
|---|---|---|---|
| JP | 2003-151878 | A | 5/2003 |
| JP | 2004-022876 | A | 1/2004 |
| JP | 2006-222158 | A | 8/2006 |
| JP | 2008-135582 | A | 6/2008 |
| JP | 2008-135583 | A | 6/2008 |
| JP | 2010-045207 | A | 2/2010 |
| JP | 2010-147361 | A | 7/2010 |
| JP | 2011-193014 | A | 9/2011 |

* cited by examiner

*Primary Examiner* — Michael Barr
*Assistant Examiner* — Cristi Tate-Sims
(74) *Attorney, Agent, or Firm* — Posz Law Group, PLC

(57) ABSTRACT

In a coating and developing treatment system including a treatment station and an interface station, the interface station has: a cleaning unit cleaning a rear surface of a wafer before the wafer is transferred into an exposure apparatus; an inspection unit inspecting whether the cleaned wafer is in an exposable state; and a wafer transfer mechanism including an arm transferring the wafer between the cleaning unit and the inspection unit. Each of the cleaning unit and the inspection unit is provided at multiple tiers in an up and down direction on the front side in the interface station, and the wafer transfer mechanism is provided in a region adjacent to the cleaning units and the inspection units.

9 Claims, 17 Drawing Sheets

SUBSTRATE TREATMENT SYSTEM, SUBSTRATE TRANSFER METHOD, AND A NON-TRANSITORY COMPUTER STORAGE MEDIUM

BACKGROUND OF THE INVENTION

1. Field of the Invention

The present invention relates to a substrate treatment system performing treatment on a substrate, a substrate transfer method in the substrate treatment system and a non-transitory computer storage medium.

2. Description of the Related Art

For example, in a photolithography process in manufacturing processes of a semiconductor device, a series of treatments such as resist coating treatment of applying a resist solution onto a wafer to form a resist film, exposure processing of exposing the resist film to a predetermined pattern, developing treatment of developing the exposed resist film and so on are sequentially performed, whereby a predetermined resist pattern is formed on the wafer. The series of treatments are performed in a coating and developing treatment system being a substrate treatment system in which various kinds of treatment units treating the wafer and transfer units transferring the wafer are installed.

For example, a coating and developing treatment system 200 conventionally includes a cassette station 201 for transferring a cassette C in/out from/to the outside, a treatment station 202 in which a plurality of treatment units performing various treatments such as resist coating treatment, developing treatment, and thermal treatment are provided at the front and the back therein, and an interface station 203 delivering a wafer between an exposure apparatus A provided outside the coating and developing treatment system 200 and adjacent thereto and the treatment station 202, which are integrally provided as illustrated in FIG. 22.

In recent year, miniaturization of a circuit pattern to be formed on the wafer is further advanced and the defocus margin in exposure processing becomes smaller. In association with that, it is required, as much as possible, to prevent particles from being brought into the exposure apparatus A. In particular, the particles on the rear surface of the wafer is becoming a problem. Therefore, to reduce, as much as possible, the particles brought into the exposure apparatus A, a cleaning unit 210 cleaning the rear surface of the wafer before it is transferred into the exposure apparatus A, an inspection unit 211 inspecting the cleaned wafer, a delivery unit 212 and wafer transfer apparatuses 213 provided at multiple tiers for delivering the wafer between the units 210 and 211 are provided in the interface station 203 in some cases (Japanese Laid-open Patent Publication No. 2008-135583)

SUMMARY OF THE INVENTION

On the other hand, the coating and developing treatment system is required to reduce the footprint that is the proportion of the coating and developing treatment system to the floor area of the clean room.

To reduce the footprint, it is necessary to downsize the treatment units and reduce the space required for wafer transfer. However, there are many constraints in downsizing of the treatment units because the configurations themselves of the treatment units need to be reviewed.

The present invention has been made in consideration of the above points and its object is to reduce the footprint of a substrate treatment system having a function of cleaning a rear surface of a substrate before exposure without changing the configuration of treatment units.

To achieve the above object, the present invention is a substrate treatment system including a treatment station in which a plurality of treatment units each treating a substrate, and an interface station delivering the substrate between the treatment station and an exposure apparatus provided outside, the interface station including: a cleaning unit cleaning at least a rear surface of the substrate before the substrate is transferred into the exposure apparatus; an inspection unit inspecting at least the rear surface of the cleaned substrate whether the substrate is exposable, before the substrate is transferred into the exposure apparatus; and a substrate transfer mechanism including an arm transferring the substrate between the cleaning unit and the inspection unit, wherein each of the cleaning unit and the inspection unit is provided at multiple tiers in an up and down direction on either a front side or a back side in the interface station, and wherein the substrate transfer mechanism is provided in a region adjacent to the cleaning units and the inspection units provided at multiple tiers in the up and down direction.

According to the present invention, each of the cleaning unit and the inspection unit is provided at multiple tiers on either a front side or a back side in the interface station, and the substrate transfer mechanism is provided in a region adjacent to the cleaning units and the inspection units, thereby making it possible to reduce the size on the front side or the back side of the interface station to downsize the interface station as compared to the prior art. Accordingly, it is possible to reduce the footprint of the substrate treatment system having the function of cleaning the rear surface of the wafer W before exposure without changing the configuration of the treatment units.

The present invention according to another aspect is a substrate transfer method in a substrate treatment system including a treatment station in which a plurality of treatment units each treating a substrate, and an interface station delivering the substrate between the treatment station and an exposure apparatus provided outside, the interface station including: a cleaning unit cleaning at least a rear surface of the substrate before the substrate is transferred into the exposure apparatus; an inspection unit inspecting at least the rear surface of the cleaned substrate whether the substrate is exposable, before the substrate is transferred into the exposure apparatus; and a substrate transfer mechanism including an arm transferring the substrate between the cleaning unit and the inspection unit, wherein each of the cleaning unit and the inspection unit is provided at multiple tiers in an up and down direction on either a front side or a back side in the interface station, wherein the substrate transfer mechanism is provided in a region adjacent to the cleaning units and the inspection units provided at multiple tiers in the up and down direction, and wherein when it is determined that a state of the substrate becomes an exposable state by re-cleaning in the cleaning unit as a result of the inspection in the inspection unit, the substrate is transferred again to the cleaning unit.

According to the present invention in yet another aspect is a non-transitory computer-readable storage medium storing a program running on a computer of a control unit controlling a substrate treatment system to cause the substrate treatment system to execute a method of transferring a substrate, said substrate treatment apparatus comprising a cleaning unit cleaning at least a rear surface of the substrate before the substrate is transferred into said exposure apparatus, an inspection unit inspecting at least the rear surface of the cleaned substrate whether the substrate is exposable, before the substrate is transferred into said exposure apparatus; and a substrate transfer mechanism including an arm transferring the substrate between said cleaning unit and said inspection unit, wherein each of said cleaning unit and said inspection unit is provided at multiple tiers in an up and down direction on either a front side or a back side in said interface station, wherein said substrate transfer mechanism is provided in a region adjacent to said cleaning units and said inspection units provided at multiple tiers in the up and down direction, and wherein said program control the substrate transfer mechanism when it is determined that a state of the substrate becomes an exposable state by re-cleaning in the cleaning unit as a result of the inspection in the inspection unit, the substrate is transferred again to the cleaning unit.

According to the present invention, it is possible to reduce the footprint of a substrate treatment system including a function of cleaning a rear surface of a substrate before exposure without changing the configuration of treatment units.

DETAILED DESCRIPTION OF THE INVENTION

Figure 1:
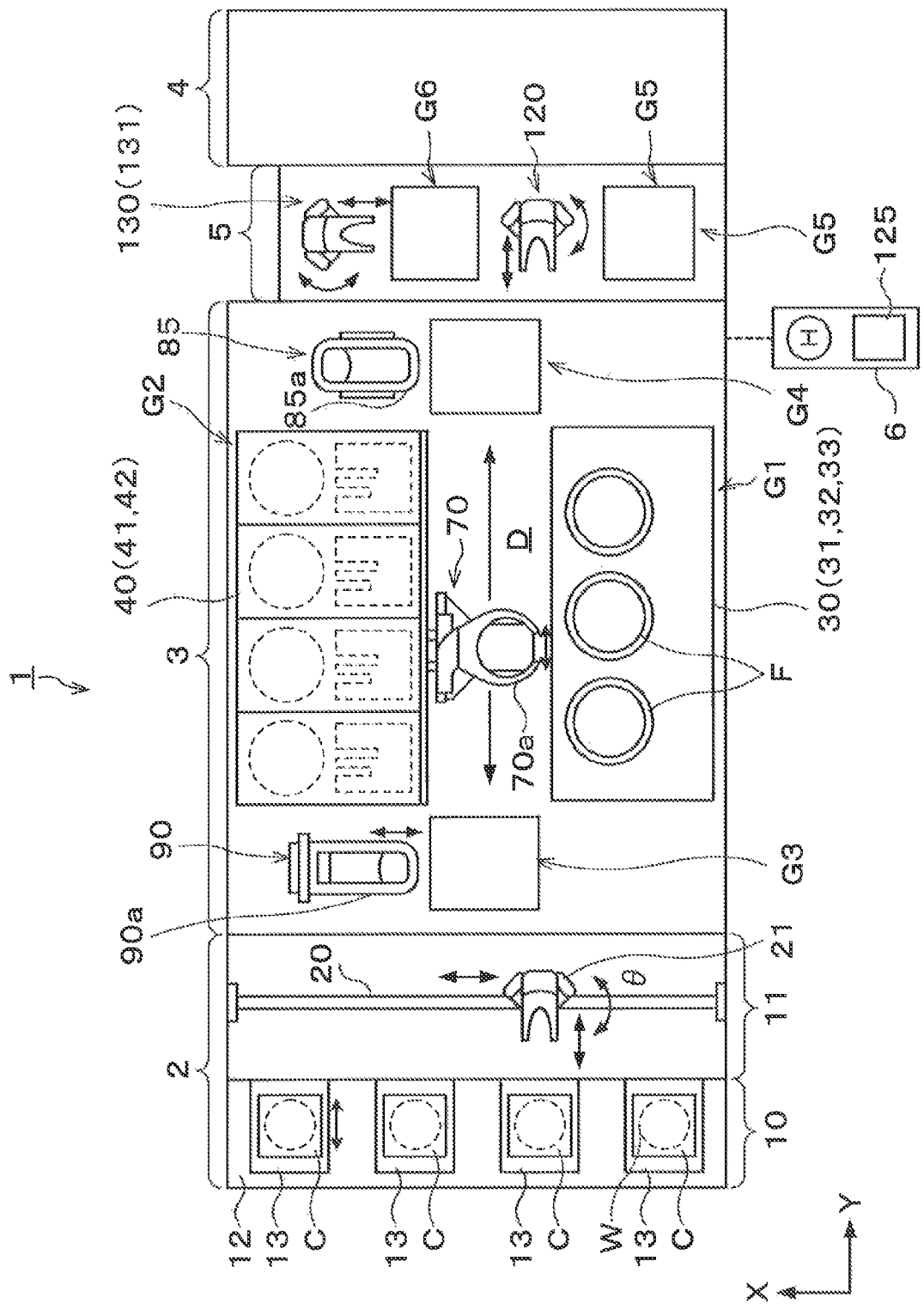
FIG. 1 is a plan view illustrating the outline of an internal configuration of a coating and developing treatment system according to this embodiment.
Figure 2:
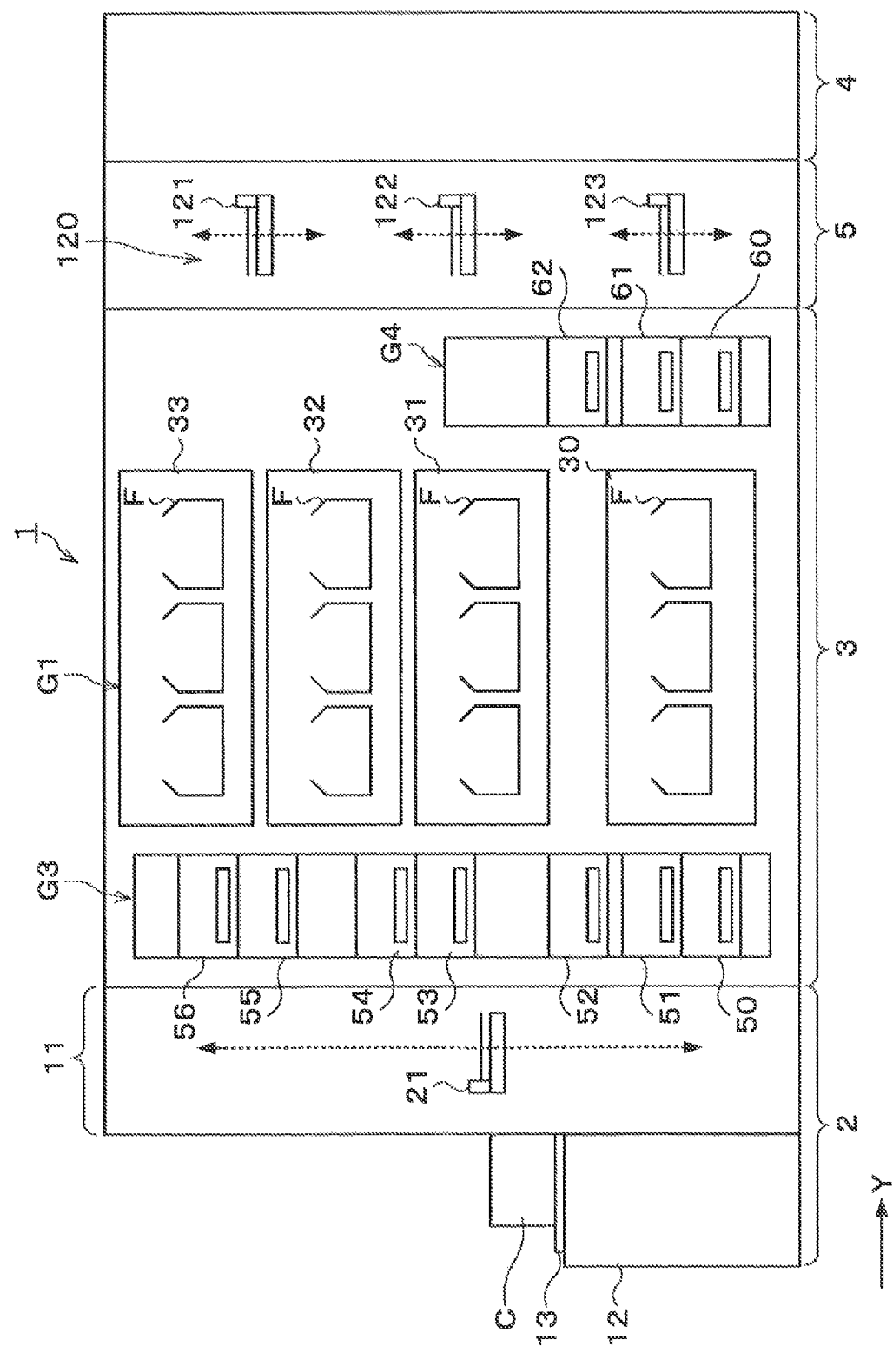
FIG. 2 is an explanatory view illustrating the outline of the internal configuration on the front side of the coating and developing treatment system according to this embodiment.
Figure 3:
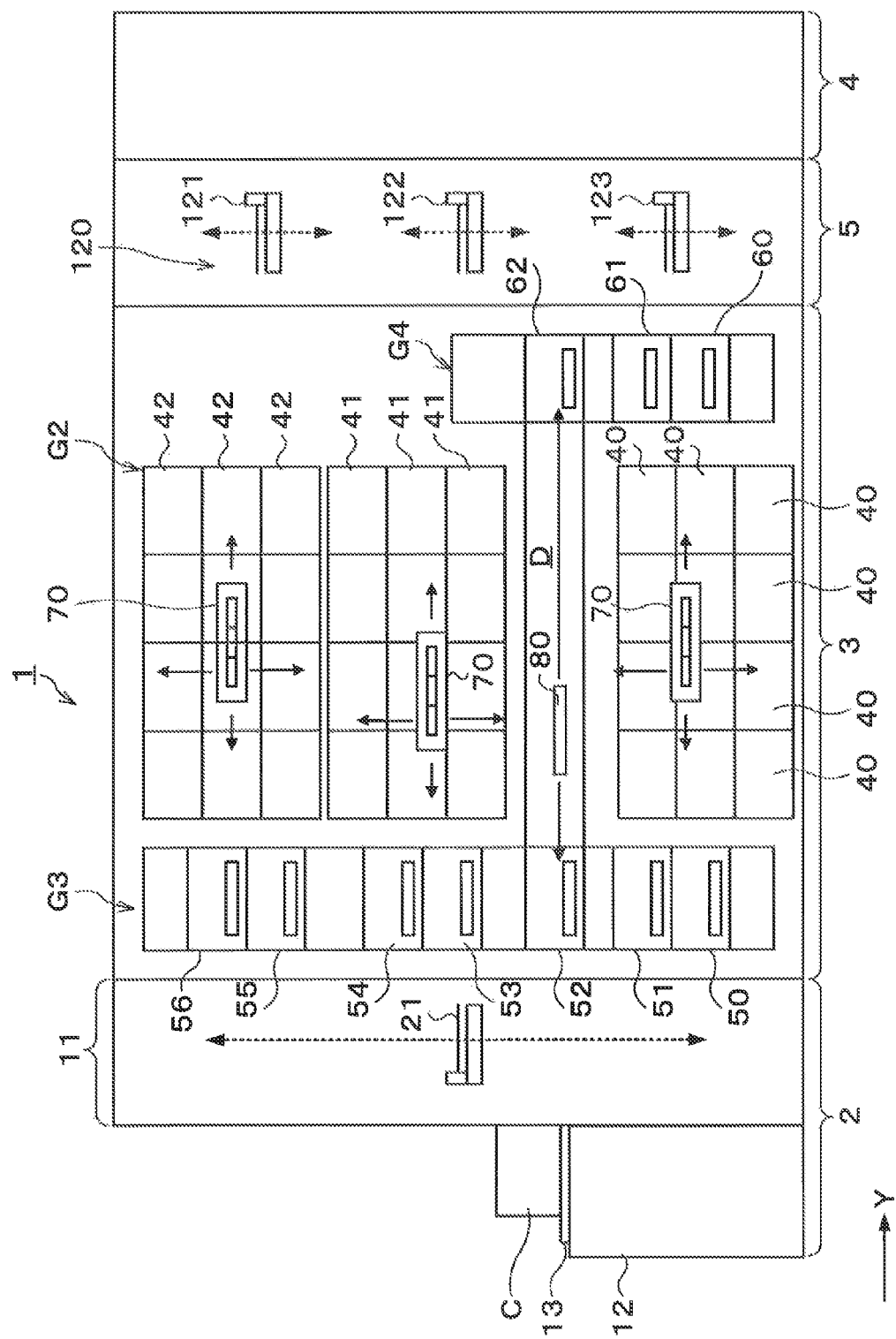
FIG. 3 is an explanatory view illustrating the outline of the internal configuration on the back side of the coating and developing treatment system according to this embodiment.

Hereinafter, embodiments of the present invention will be described. FIG. 1 is an explanatory view illustrating the outline of an internal configuration of a coating and developing treatment system 1 as a substrate treatment system according to this embodiment. FIG. 2 and FIG. 3 are explanatory views illustrating the outline of the internal configuration of the coating and developing treatment system 1 from the front side and the back side, respectively.

The coating and developing treatment system 1 has, as illustrated in FIG. 1, a configuration in which, for example, a cassette station 2 to/from which a cassette C housing a plurality of wafers W therein is transferred in/out from/to the outside, a treatment station 3 including a plurality of treatment units performing predetermined treatments on the wafer W in the photolithography processing, and an interface station 5 delivering the wafers W to/from an exposure apparatus 4, are integrally connected. The coating and developing treatment system 1 further has a control unit 6 performing control on various treatment units and so on.

The cassette station 2 is composed of, for example, a cassette transfer-in/out section 10 and a wafer transfer section 11. The cassette transfer-in/out section 10 is provided, for example, at the end on a Y-direction negative direction (the left direction in FIG. 1) side in the coating and developing treatment system 1. In the cassette transfer-in/out section 10, a cassette mounting table 12 as a cassette mounting part is provided. On the cassette mounting table 12, for example, four cassette mounting plates 13 are provided. The cassette mounting plates 13 are provided side by side in a line in an X-direction (an up and down direction in FIG. 1) being the horizontal direction. On the cassette mounting plates 13, cassettes C can be mounted when the cassettes C are transferred in/out from/to the outside of the coating and developing treatment system 1.

In the wafer transfer section 11, a wafer transfer apparatus 21 movable on a transfer path 20 extending in the X-direction is provided as illustrated in FIG. 1. The wafer transfer apparatus 21 is movable also in the up and down direction and around the vertical axis (in a θ-direction) and can transfer the wafer W between the cassette C on each of the cassette mounting plates 13 and a later-described delivery unit in the third block G3 in the treatment station 3.

In the treatment station 3 adjacent to the cassette station 2, a plurality of, for example, four blocks G1, G2, G3, G4 are provided each of which includes various kinds of units. On the front side (an X-direction negative direction side in FIG. 1) in the treatment station 3, the first block G1 is provided, and on the back side (an X-direction positive direction side in FIG. 1) in the treatment station 3, the second block G2 is provided. Further, on the cassette station 2 side (a Y-direction negative direction side in the in FIG. 1) in the treatment station 3, the third block G3 is provided, and on the interface station 5 side (a Y-direction positive direction side in the FIG. 1) in the treatment station 3, the fourth block G4 is provided.

For example, in the first block G1, a plurality of solution treatment units, for example, a lower anti-reflection film forming unit 30 forming an anti-reflection film under a resist film of the wafer W (hereinafter, referred to as a "lower anti-reflection film"), a resist coating unit 31 applying a resist solution onto the wafer W to form a resist film, an upper anti-reflection film forming unit 32 forming an anti-reflection film on top of the resist film of the wafer W (hereinafter, referred to as an "upper anti-reflection film"), and a developing treatment unit 33 performing developing treatment on the wafer W, are stacked at four tiers from the bottom as illustrated in FIG. 2.

Each of the units 30 to 33 in the first block G1 has a plurality of cups F each of which houses the wafer W therein during treatment in the horizontal direction to be able to treat a plurality of wafers W in parallel.

For example, in the second block G2, as illustrated in FIG. 3, thermal treatment units 40 each performing thermal treatment on the wafer W, and adhesion units 41 as hydrophobic treatment apparatuses each performing hydrophobic treatment on the wafer W, and edge exposure units 42 each exposing the outer peripheral portion of the wafer W are arranged one on top of the other in the vertical direction and side by side in the horizontal direction as illustrated in FIG. 3. The thermal treatment unit 40 has a thermal plate that mounts and heats the wafer W thereon and a cooling plate that mounts and cools the wafer W thereon so as to be able to perform both heat treatment and cooling treatment. Note that the numbers and the arrangement of the thermal treatment units 40, adhesion units 41, and edge exposure units 42 can be arbitrarily selected.

For example, in the third block G3, a plurality of delivery units 50, 51, 52, 53, 54, 55, 56 are provided in order from the bottom. Further, in the fourth block G4, a plurality of delivery units 60, 61, 62 are provided in order from the bottom.

A wafer transfer region D is formed in a region surrounded by the first block G1 to the fourth block G4 as illustrated in FIG. 1. In the wafer transfer region D, for example, a plurality of, for example, three wafer transfer apparatuses 70 are provided. The wafer transfer apparatuses 70 have the same structure.

The wafer transfer apparatus 70 has a transfer arm 70a that is movable, for example, in the Y-direction, a forward and backward direction, the θ-direction, and the up and down direction. The transfer arm 70a can move in the wafer transfer region D and transfer the wafer W to a predetermined unit in the first block G1, the second block G2, the third block G3, and the fourth block G4 therearound. A plurality of wafer transfer apparatuses 70 are provided one above top of the other as illustrated in FIG. 3 and can transfer the wafers W, for example, to predetermined units at the similar levels in the blocks G1 to G4.

Further, in the wafer transfer region D, a shuttle transfer apparatus 80 linearly transferring the wafer W between the third block G3 and the fourth block G4 is provided.

The shuttle transfer apparatus 80 is configured to be linearly movable, for example, in the Y-direction in FIG. 3. The shuttle transfer apparatus 80 can move in the Y-direction while supporting the wafer W and transfer the wafer W between the delivery unit 52 in the third block G3 and the delivery unit 62 in the fourth block G4.

As illustrated in FIG. 1, a wafer transfer apparatus 90 is provided on the X-direction positive direction side of the third block G3. The wafer transfer apparatus 90 has a transfer arm 90a that is movable, for example, in the forward and backward direction, the θ-direction, and the up and down direction. The wafer transfer apparatus 90 can move up and down while supporting the wafer W to transfer the wafer W to each of the delivery units in the third block G3.

On the X-direction positive direction side of the fourth block G4, a wafer transfer apparatus 85 is provided. The wafer transfer apparatus 85 has a transfer arm 85a that is movable, for example, in the forward and backward direction, the θ-direction, and the up and down direction. The wafer transfer apparatus 85 can move up and down while supporting the wafer W to transfer the wafer W to the interface station 5.

In the interface station 5, two blocks G5, G6 each including various kinds of units are provided. For example, on the front side (an X-direction negative direction side in FIG. 1) in the interface station 5, the fifth block G5 is provided. The sixth block G6 is provided on an X-direction positive direction side of the fifth block G5.

Figure 4:
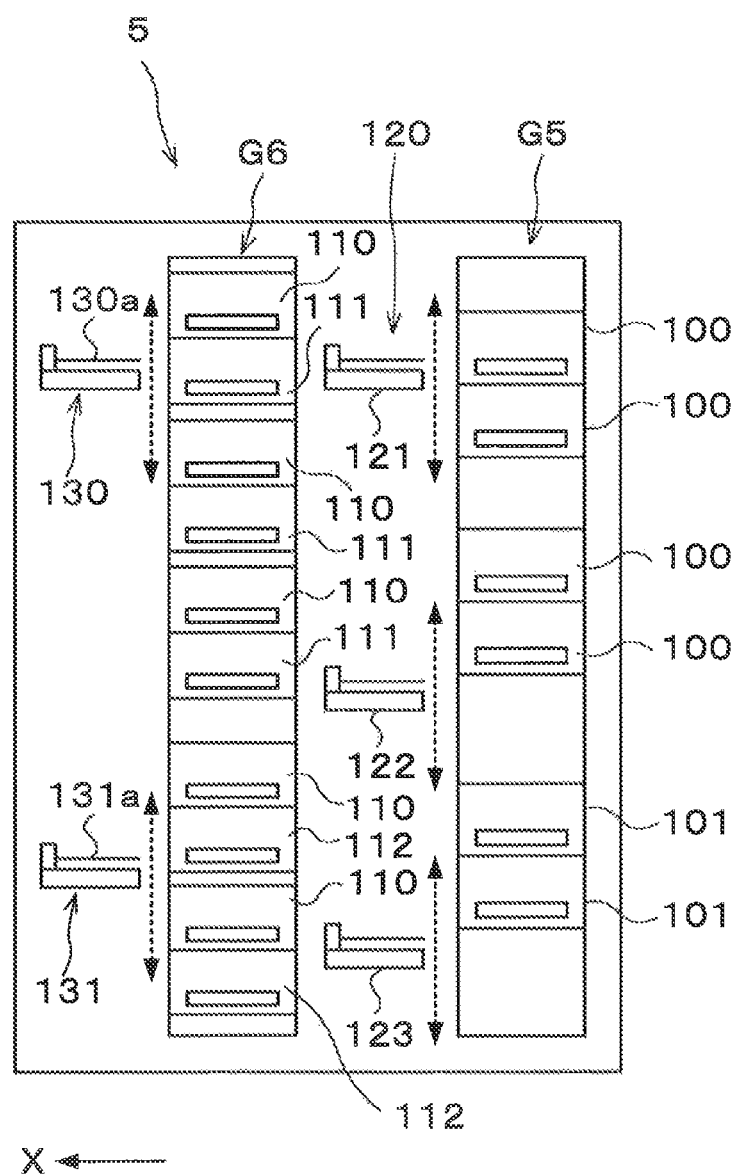
FIG. 4 is an explanatory view illustrating the outline of a configuration of an interface station according to this embodiment.

For example, in the fifth block G5, cleaning units 100 each cleaning the rear surface of the wafer W before the wafer W is transferred into the exposure apparatus 4 and inspection units 101 each inspecting whether the rear surface of the wafer W cleaned in the cleaning unit 100 is in a state of allowing exposure in the exposure apparatus 4 before the wafer W is transferred into the exposure apparatus 4 are provided at multiple tiers stacked in order from the top as illustrated in FIG. 4. Note that, for example, the cleaning units 100 are provided at four tiers and the inspection units 101 are provided at two tiers in this embodiment. Note that FIG. 4 is a side view illustrating the outline of an internal configuration of the interface station 5 when the interface station 5 is seen from the cassette station 2 side.

In the sixth block G6, delivery units 110 each delivering the wafer W to/from the treatment station 3 via the wafer transfer apparatus 85, buffer units 111 as buffer housing parts each temporarily housing the wafer W inspected in the inspection unit 101, and temperature regulation units 112 as temperature regulation mechanisms each regulating the temperature of the inspected wafer W to a predetermined temperature before it is transferred into the exposure apparatus 4, are provided at multiple tiers in the up and down direction. More specifically, in an upper part of the sixth block G6, the delivery units 110 and the buffer units 111 are arranged alternately stacked at three tiers each in this order from the top. In a lower part of the sixth block G6, the delivery units 110 and the temperature regulation units 112 are arranged alternately stacked at two tiers each in this order from the top. The temperature regulation unit 112 has a temperature regulation plate including a temperature regulation member such as a Peliter element and thus can temperature-regulate the wafer W mounted on the temperature regulation plate to a predetermined temperature, for example, room temperature.

In a region between the fifth block G5 and the sixth block G6 and adjacent to the fifth block G5, a wafer transfer mechanism 120 as a substrate transfer mechanism is provided. The wafer transfer mechanism 120 has a first transfer arm 121, a second transfer arm 122, and a third transfer arm 123 as a plurality of transfer arms. Each of the transfer arms 121, 122, 123 is configured to be movable, for example, in the forward and backward direction, the θ-direction, and the up and down direction. Each of the transfer arms 121, 122, 123 can thus move up and down while supporting the wafer W to transfer the wafer W between the units in the blocks G5, G6. Note that as the wafer transfer mechanism 120, the plurality of independently moving transfer arms 121, 122, 123 are illustrated in FIG. 4, but one transfer arm provided with a plurality of, for example, three sets of tweezers holding the wafer W may be used in place of the plurality of transfer arms.

The transfer of the wafer W by the wafer transfer mechanism 120 is controlled by a wafer transfer control part 125 as a substrate transfer control part of the control unit 6 illustrated in FIG. 1. The wafer transfer control part 125 controls the wafer transfer mechanism 120 so that the first transfer arm 121 transfers the wafer W between the cleaning unit 100 and the delivery unit 110. The wafer transfer control part 125 further controls the wafer transfer mechanism 120 so that the second transfer arm 122 transfers the wafer W cleaned in the cleaning unit 100 to the inspection unit 101, and the third transfer arm 123 transfers the wafer W inspected in the inspection unit 101 to the buffer unit 111. Further, that the wafer transfer control part 125 also controls the operations of the other wafer transfer apparatuses in the coating and developing treatment system 1.

In a region on an X-direction positive direction side adjacent to the sixth block G6 in FIG. 4, a plurality of wafer transfer apparatuses 130, 131 are provided in the up and down direction. The wafer transfer apparatuses 130, 131 have respective transfer arms 130*a*, 131*a* movable, for example, in the forward and backward direction, the θ-direction, and the up and down direction. The transfer arms 130*a* moves up and down while holding the wafer W to transfer the wafer W between the delivery unit 110 and the buffer unit 111 in the upper part of the sixth block G6. The transfer arms 131*a* moves up and down while holding the wafer W to transfer the wafer W between the units 110 and 112 in the lower part of the sixth block G6 and between the unit 110, 112 and the exposure apparatus 4.

Figure 5:
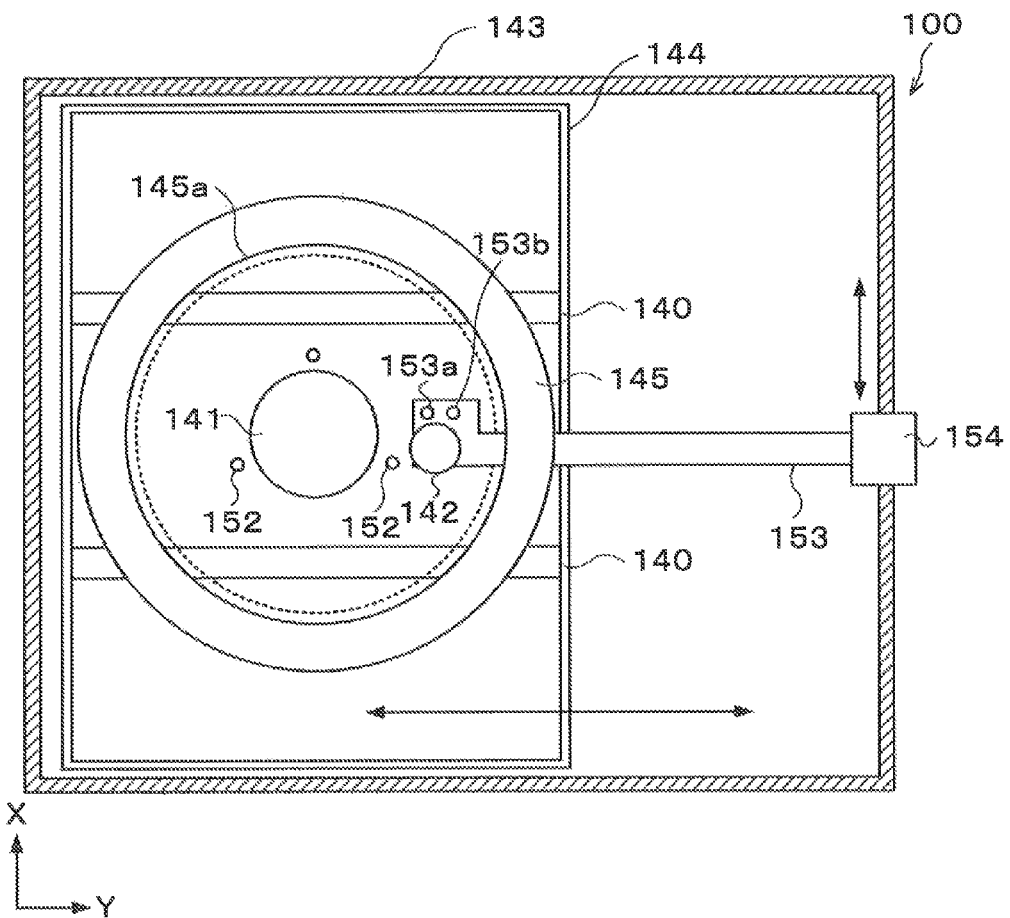
FIG. 5 is a plan view illustrating the outline of a configuration of a cleaning unit.
Figure 6:
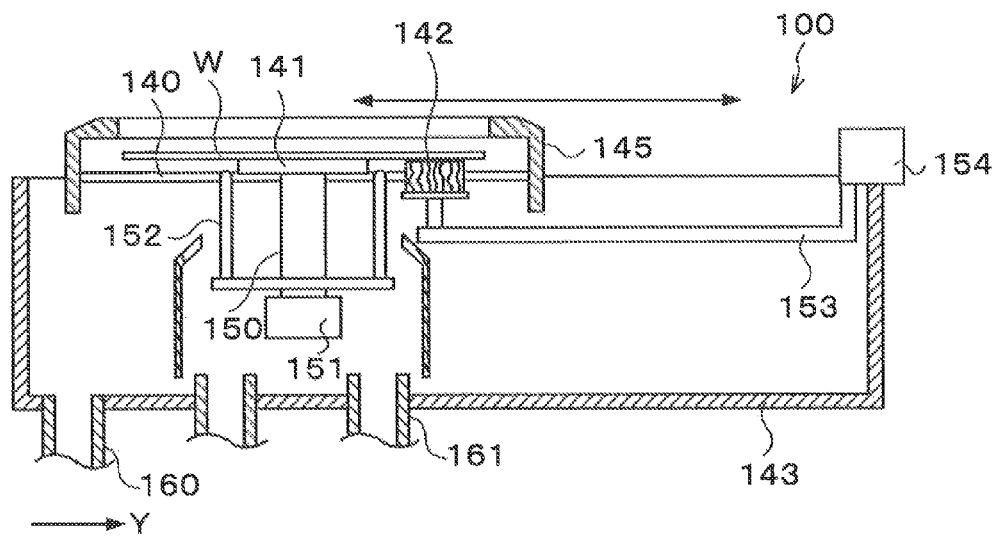
FIG. 6 is a longitudinal sectional view illustrating the outline of the configuration of the cleaning unit.

Next, the configuration of the cleaning unit 100 will be described. FIG. 5 is a plan view illustrating the outline of the configuration of the cleaning unit 100, and FIG. 6 is a longitudinal sectional view illustrating the outline of the configuration of the cleaning unit 100.

The cleaning unit 100 has two suction pads 140, 140 horizontally suction-holding the wafer W transferred via the first transfer arm 121, a spin chuck 141 horizontally suction-holding the wafer W received from the suction pads 140, a brush 142 cleaning the rear surface of the wafer W, and a casing 143 having an upper surface open.

As illustrated in FIG. 5, the two suction pads 140, 140 are provided substantially parallel to each other with the spin chuck 141 intervening therebetween in a plan view to be able to hold the edge portion of the rear surface of the wafer W. Each of the suction pads 140, 140 is supported at its both ends by a frame body 144 movable in the horizontal direction and the up and down direction by a drive mechanism (not illustrated).

On an upper surface of the frame body 144, an upper cup 145 is provided. In an upper surface of the upper cup 145, an opening 145*a* with a diameter larger than the diameter of the wafer W is formed so that the wafer W is delivered between the first transfer arm 121 and the suction pads 140 through the opening 145*a*.

As illustrated in FIG. 6, the spin chuck 141 is connected to a drive mechanism 151 via a shaft 150 so that the spin chuck 141 is configured to freely rotate and rise and lower by means of the drive mechanism 151.

Around the spin chuck 141, raising and lowering pins 152 are provided which freely rise and lower by means of a raising and lowering mechanism (not illustrated).

The brush 142 is configured, for example, by bundling many plastic fibers in a column shape, and is supported by a support body 153. The support body 153 is connected to a drive mechanism 154. The drive mechanism 154 is connected to the casing 143 and can horizontally move in the X-direction in FIG. 5 and along the casing 143. Accordingly, by moving the drive mechanism 154 in the X-direction, the brush 142 can be moved in the X-direction in FIG. 5 via the support body 153. The brush 142 is configured to freely rotate by means of a drive mechanism (not illustrated) built in the support body 153 so that particles adhering to the rear surface of the wafer W can be removed by rotating the brush 142 with its upper surface pressed against the rear surface of the wafer W and sliding the brush 142 on the rear surface of the wafer W.

Further, at the tip end of the support body 153, a cleaning solution nozzle 153*a* supplying a cleaning solution for washing away the particles removed by the brush, and a purge nozzle 153*b* supplying gas such as nitrogen for drying the cleaning solution adhering to the rear surface of the wafer W after cleaning, are provided.

At the bottom of the casing 143, a drain pipe 160 draining the cleaning solution and an exhaust pipe 161 forming downward airflow in the cleaning unit 100 and exhausting the airflow are provided.

Figure 7:
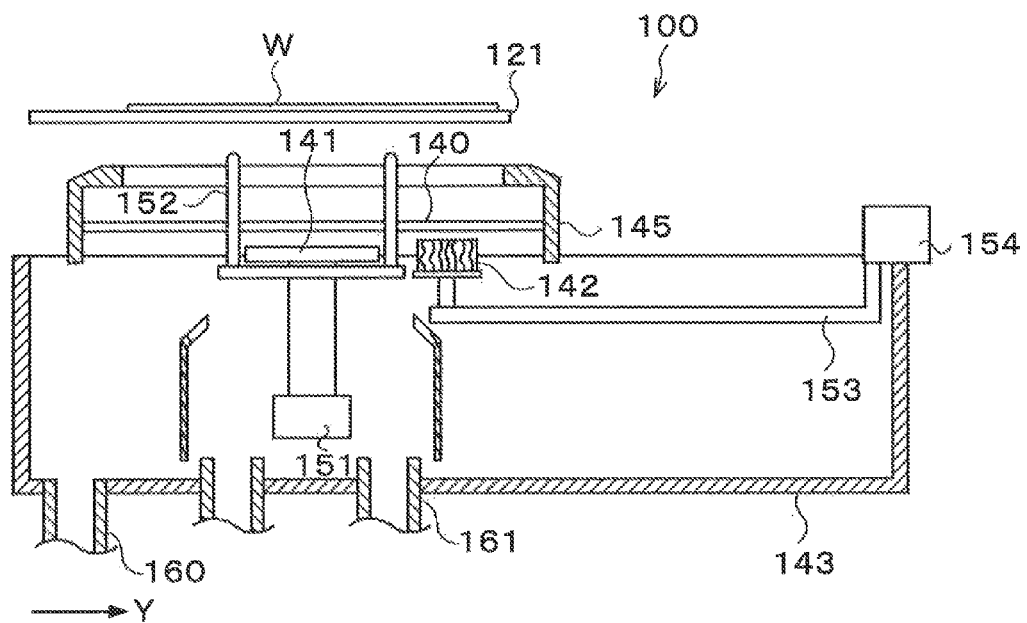
FIG. 7 is an explanatory view illustrating the appearance in which a wafer is delivered to the cleaning unit.
Figure 8:
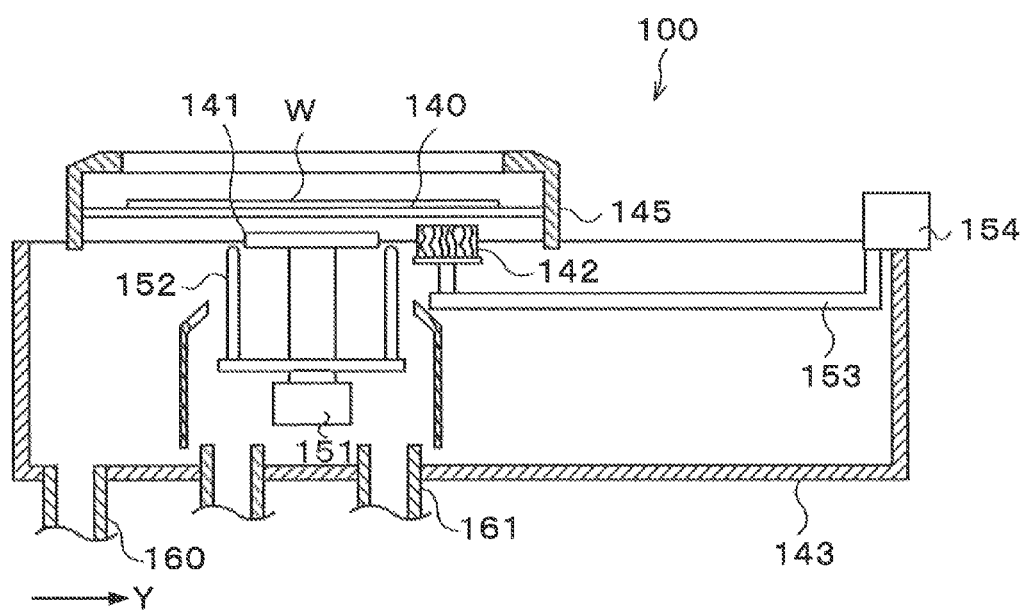
FIG. 8 is an explanatory view illustrating the state in which the wafer has been delivered to the cleaning unit.

Next, the cleaning of the wafer W in the cleaning unit 100 will be described. For the cleaning of the wafer W, the wafer W is transferred by the first transfer arm 121 to above the upper cup 145 as illustrated in FIG. 7. Then, the raising and pins 152 are raised and the wafer W is delivered to the raising and lowering pins 152. In this event, the suction pads 140 are waiting with the upper surfaces thereof located at a position higher than the upper surface of the brush 142, and the spin chuck 141 is retracted to a position lower than the upper surface of the brush 142. Thereafter, the raising and lowering pins 152 are lowered, whereby the wafer W is delivered to and held on the suction pads 140 as illustrated in FIG. 8.

Figure 9:
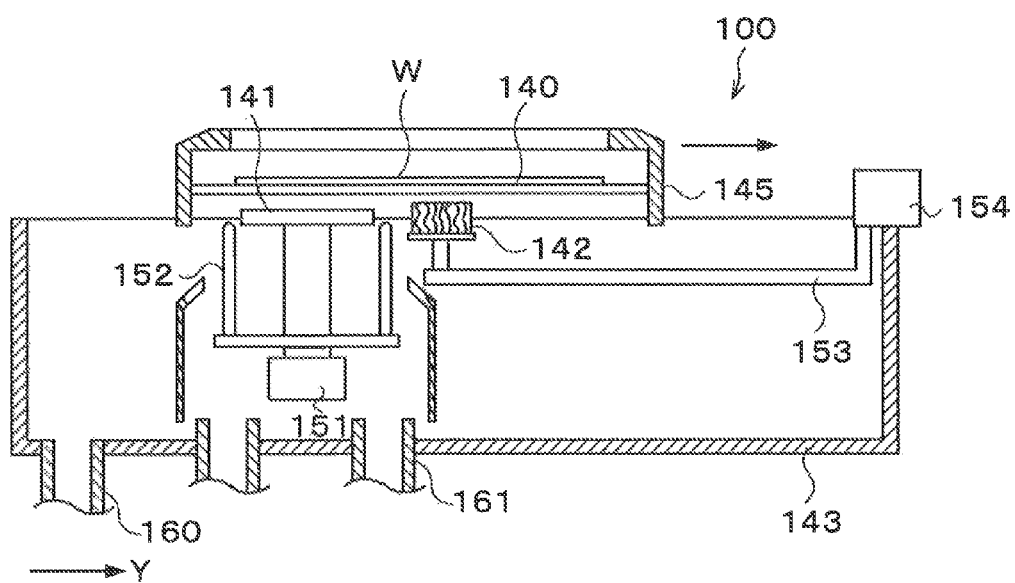
FIG. 9 is an explanatory view illustrating the appearance in which the wafer is moved in the horizontal direction inside the cleaning unit.

Subsequently, the frame body 144 is horizontally moved so that, for example, the brush 142 is located in a region corresponding to the center part of the rear surface of the wafer W with the wafer W suction-held by the suction pads 140 as illustrated in FIG. 9. Then, the suction pads 140 are lowered and the rear surface of the wafer W is pressed against the upper surface of the brush 142.

Then, the cleaning solution is supplied from the cleaning solution nozzle 153*a* and the brush 142 is rotated to clean the center part of the rear surface of the wafer W. In this event, the support body 153 reciprocates in the X-direction in FIG. 5 and the frame body 144 reciprocates in the Y-direction, whereby the center part of the rear surface of the wafer W is evenly cleaned.

Figure 10:
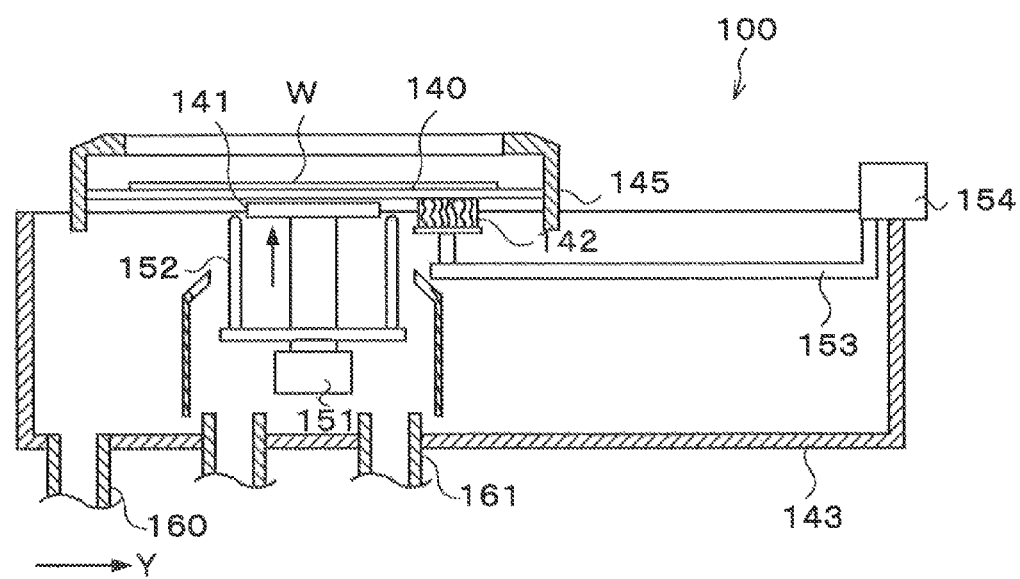
FIG. 10 is an explanatory view illustrating the appearance in which the wafer is moved in the horizontal direction inside the cleaning unit.

After the cleaning of the center part of the rear surface of the wafer W is finished, the frame body 144 is horizontally moved so that the center of the wafer W is aligned with the center of the spin chuck 141 in a plan view as illustrated in FIG. 10. Then, the spin chuck 141 is raised, whereby the wafer W is delivered from the suction pads 140 to the spin chuck 141.

Figure 11:
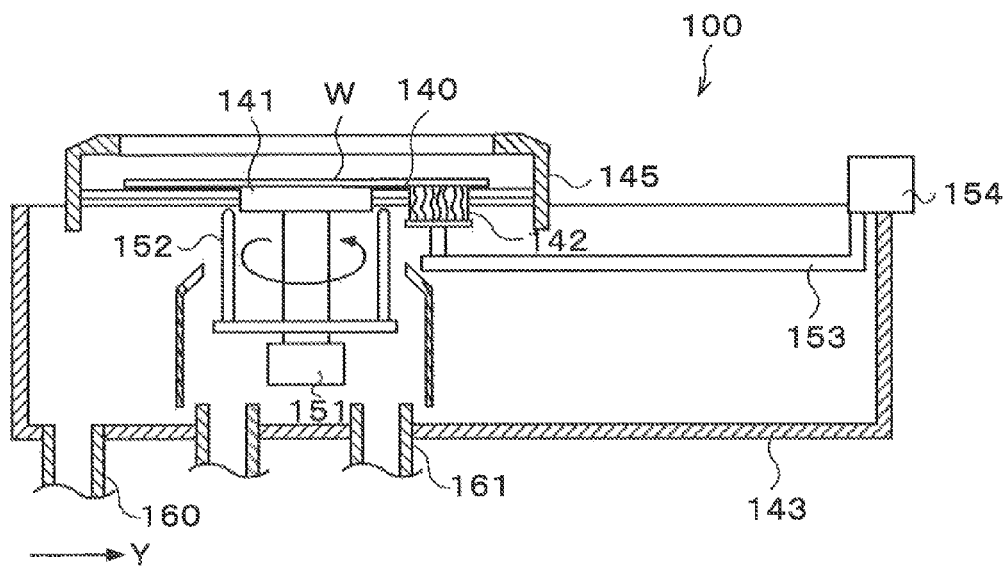
FIG. 11 is an explanatory view illustrating the appearance in which an edge portion of the wafer is cleaned in the cleaning unit.

Thereafter, as illustrated in FIG. 11, the wafer W is rotated with the brush 142 pressed against the rear surface of the wafer W and the brush 142 is slid in the X-direction via the support body 153, whereby the edge portion of the rear surface of the wafer W is cleaned. This removes the particles on the entire rear surface of the wafer W.

After the cleaning of the rear surface of the wafer W is completed, the rotation of the brush 142 and the supply of the cleaning solution are stopped and the spin chuck 141 is rotated at a high speed, whereby the cleaning solution adhering to the rear surface of the wafer W is spin-dried. In this event, the purge by the purge nozzle 153*b* is performed in parallel.

After the drying is finished, the wafer W is delivered to the second transfer arm 122 in the order reverse to that when it is transferred to the cleaning unit 100.

Figure 12:
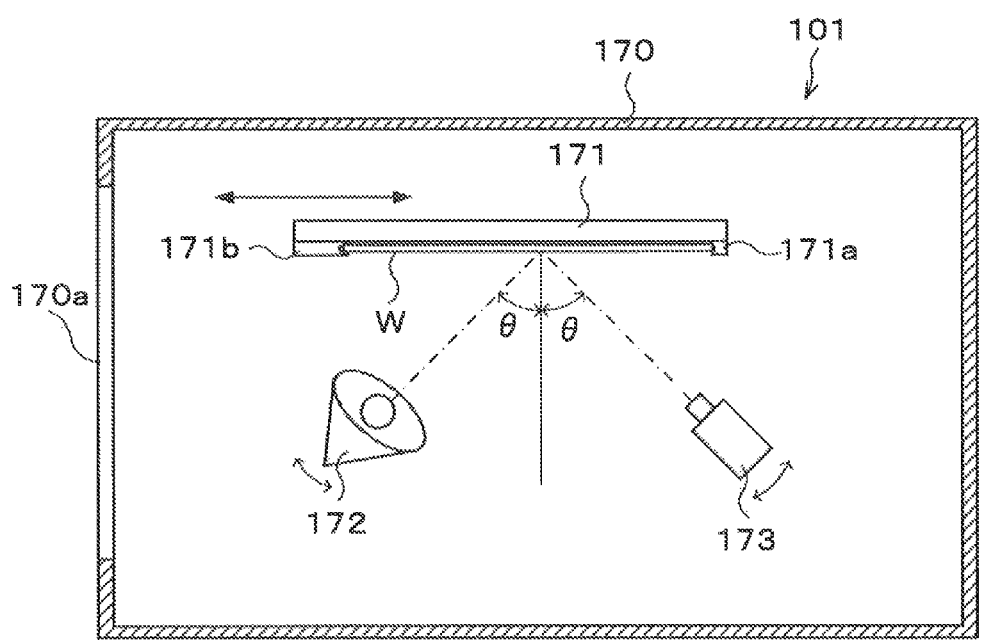
FIG. 12 is a longitudinal sectional view illustrating the outline of a configuration of an inspection unit.

Next, the configuration of the inspection unit 101 will be described. FIG. 12 is a longitudinal sectional view illustrating the outline of the configuration of the inspection unit 101.

The inspection unit 101 has a casing 170 in which a holding arm 171 holding the wafer W with at least the rear surface of the wafer W open directed downward, a light source 172 applying parallel light rays in line shape to the rear surface of the wafer W held by the holding arm 171, and a camera 173 picking up an image of the light applied to the rear surface of the wafer W are provided. The holding arm 171 is configured to be movable in the horizontal direction by means of a drive mechanism (not illustrated).

A locking part 171a projecting downward is formed at the tip end of the holding arm 171, and a movable holding part 171b movable in the direction of the diameter of the wafer W by means of a not-illustrated drive mechanism is provided on the lower surface of the holding arm 171. The holding arm 171 can hold, by the locking part 171a and the movable holding part 171b, the wafer W delivered from the second transfer arm 122 entering the casing 170 through an opening 170a of the casing 170 and hold the wafer W with the rear surface directed downward.

The light source 172 is disposed below the holding arm 171 to apply the light rays at a predetermined angle of θ with respect to the rear surface of the wafer W. The camera 173 is disposed below the holding arm 171 in a state of being tilted at the predetermined angle of θ, similarly to the light source 172, with respect to the rear surface of the wafer W to pick up an image of the light rays applied to the rear surface of the wafer W.

The light source 172 and the camera 173 are adjustable in application angle and imaging angle by means of a not-illustrated tuning mechanism. This enables observation of the particles, which cannot be observed by light rays applied at a certain angle, by applying the light rays at a different angle.

In the inspection unit 101, the holding arm 171 moves in the horizontal direction while holding the wafer W and the camera 173 continuously picks up an image of the light rays applied to the rear surface of the wafer W to thereby pick up an image of the entire rear surface of the wafer W. The image picked up by the camera 173 is inputted into the control unit 6, and the control unit 6 determines whether the state of the rear surface of the wafer W allows exposure in the exposure apparatus 4. Note that the control unit 6 determines whether to perform exposure on the wafer W in the exposure apparatus 4 based on the number and an adhesion range of particles adhering to the rear surface of the wafer W, or the height and size of the particles.

The control unit 6 is composed of a computer including, for example, a CPU and a memory. In the control unit 6, a treatment recipe in which contents of the wafer treatment in the various treatment units in the coating and developing treatment system 1 and the transfer route of each wafer W are stored as a program, for example, in the memory. By executing the program, the control unit 6 controls the various treatment units in the coating and developing treatment system 1, and the operations of the wafer transfer mechanism 120 and the wafer transfer apparatuses by the above-described wafer transfer control part 125, to thereby control the various treatments and transfer of the wafers W in the coating and developing treatment system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 6.

Figure 13:
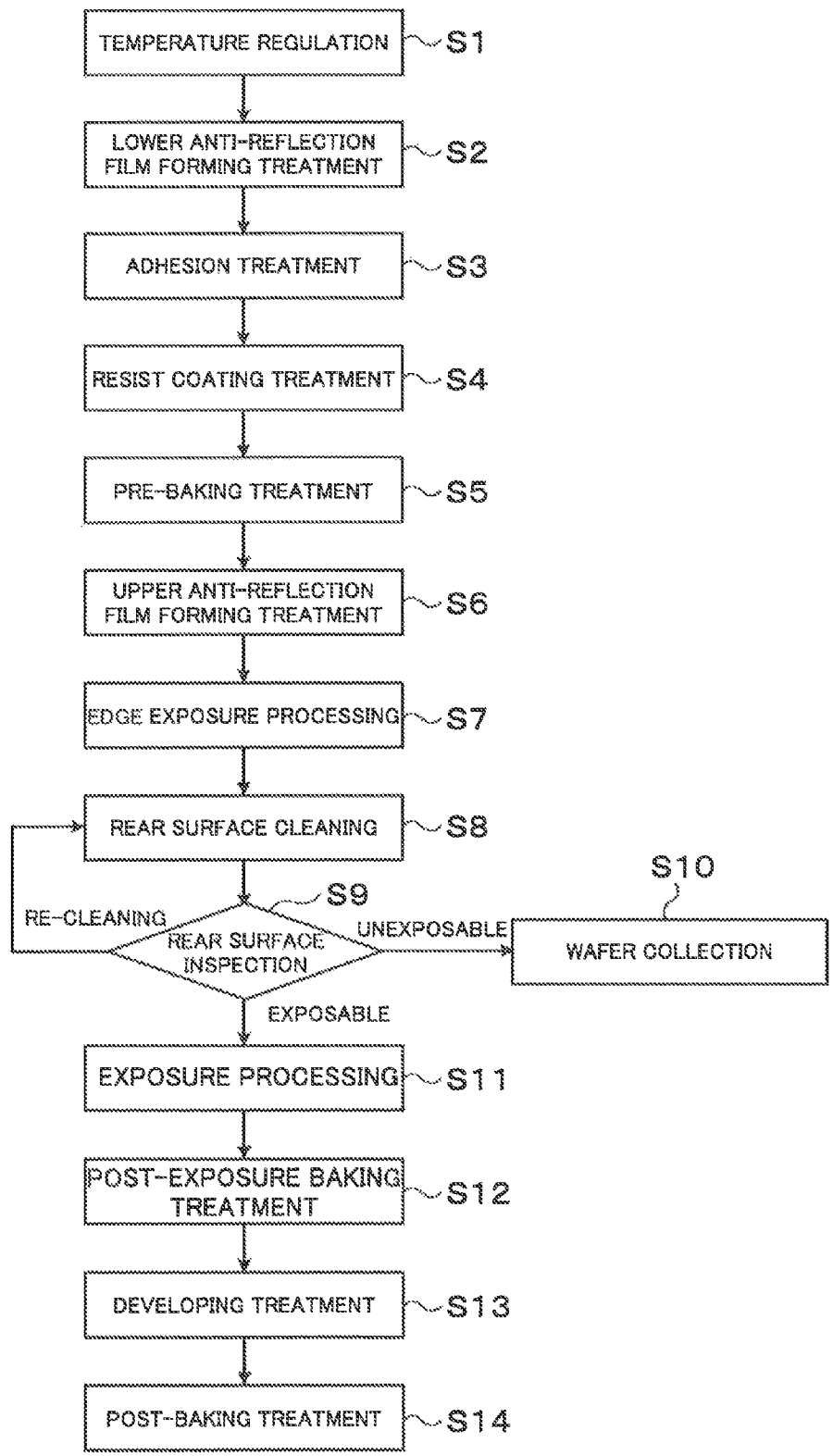
FIG. 13 is a flowchart illustrating main steps of wafer treatment performed in the coating and developing treatment system.

In the coating and developing treatment system 1 configured as described above, for example, the following wafer treatment is performed. FIG. 13 is a flowchart illustrating an example of main steps of the wafer treatment.

For the treatment on the wafer W, the cassette C housing a plurality of wafers W therein is first mounted on a predetermined cassette mounting plate 13 in the transfer-in/out section 10. Then, the wafers W in the cassette C are successively taken out by the wafer transfer apparatus 21 and transferred, for example, to the delivery unit 53 in the third block G3 in the treatment station 3.

Next, the wafer W is transferred by the wafer transfer apparatus 70 to the thermal treatment unit 40 in the second block G2 and temperature-regulated (Step S1 in FIG. 13). The wafer W is then transferred by the wafer transfer apparatus 70, for example, to the lower anti-reflection film forming unit 30 in the first block G1, where a lower anti-reflection film is formed on the wafer W (Step S2 in FIG. 13). The wafer W is then transferred to the thermal treatment unit 40 in the second block G2 and subjected to heat treatment. The wafer W is then returned to the delivery unit 53 in the third block G3.

The wafer W is then transferred by the wafer transfer apparatus 90 to the delivery unit 54 in the same third block G3. The wafer W is then transferred by the wafer transfer apparatus 70 to the adhesion unit 41 in the second block G2 and subjected to adhesion treatment (Step S3 in FIG. 13). The wafer W is then returned by the wafer transfer apparatus 70 to the resist coating unit 31, where a resist film is formed on the wafer W (Step S4 in FIG. 13). The wafer W is then transferred by the wafer transfer apparatus 70 to the thermal treatment unit 40 and subjected to pre-baking treatment (Step S5 in FIG. 13). Then, the wafer W is transferred by the wafer transfer apparatus 70 to the delivery unit 55 in the third block G3.

Subsequently, the wafer W is transferred by the wafer transfer apparatus 70 to the upper anti-reflection film forming unit 32, where an upper anti-reflection film is formed on the wafer W (Step S6 in FIG. 13). The wafer W is then transferred by the wafer transfer apparatus 70 to the thermal treatment unit 40 and heated and temperature-regulated. The wafer W is then transferred to the edge exposure unit 42 and subjected to edge exposure processing (Step S7 in FIG. 13).

The wafer W is then transferred by the wafer transfer apparatus 70 to the delivery unit 56 in the third block G3.

The wafer W is then transferred by the wafer transfer apparatus 90 to the delivery unit 52 and transferred by the shuttle transfer apparatus 80 to the delivery unit 62 in the fourth block G4.

The wafer W is then transferred by the wafer transfer apparatus 85 to the delivery unit 110 in the sixth block G6. The wafer W is then transferred by the first transfer arm 121 to the cleaning unit 100, in which the rear surface of the wafer W is cleaned (Step S8 in FIG. 13).

The wafer W whose rear surface has been cleaned is transferred by the second transfer arm 122 to the inspection unit 101 in which the rear surface of the wafer W is inspected (Step S9 in FIG. 13). The wafer W is then transferred by the third transfer arm 123 to the buffer unit 111 and temporarily housed in the buffer unit 111 until the inspection result of the wafer W in the inspection unit 101 is available.

After the inspection result in the inspection unit 101 is available, the wafer transfer control part 125 controls the wafer transfer mechanism 120 based on a predetermined rule to transfer the wafer W. More specifically, as a result of the inspection in the inspection unit 101, when it is determined that the wafer W is in a state of being exposable in the exposure apparatus 4, the wafer W is transferred by the third transfer arm 123 to the temperature regulation unit 112 and then transferred by the transfer arm 131a to the exposure apparatus 4. As a result of the inspection, when it is determined that the wafer W is in a state of being unexposable in the exposure apparatus 4, the subsequent treatments on the wafer W are stopped and the wafer W is transferred by the third transfer arm 123 to the delivery unit 110. Thereafter, the wafer W for which the subsequent treatments are stopped is transferred by the wafer transfer apparatus 85 to the treatment station 3, and then collected into a cassette C on a predetermined cassette mounting plate 13 (Step S10 in FIG. 13). Note that the route for collecting the wafer W determined to be unexposable may be a route using, for example, the shuttle transfer apparatus 80 or a route for collecting the wafer W via the tier of the developing treatment unit 33 in the first block G1. The reason why the tier of the developing treatment unit 33 is used is that the transfer direction of the exposed wafer W at the tier of the developing treatment unit 33 of the exposed wafer W is the direction from the exposure apparatus 4 to the cassette station 2 side as with the transfer direction of the wafer W determined to be unexposable, and therefore the wafer W determined to be unexposable can be transferred without interfering with the transfer of normal wafers W.

As a result of the inspection, when it is determined that the wafer W is in a state of being unexposable under the existing condition but becoming exposable in the exposure apparatus 4 by re-cleaning in the cleaning unit 100, the wafer W is delivered by the third transfer arm 123 again to the cleaning unit 100. The wafer W re-cleaned in the cleaning unit 100 is then transferred by the second transfer arm 122 again to the inspection unit 101. Thereafter, when the wafer W is determined to be exposable in the inspection unit 101, the wafer W is transferred by the third transfer arm 123 to the temperature regulation unit 112, and then transferred by the wafer transfer apparatus 130 to the exposure apparatus 4 and subjected to exposure processing (Step S11 in FIG. 13).

The wafer W which has been subjected to the exposure processing is transferred by the transfer arm 131a to the delivery unit 110 in the sixth block G6. The wafer W is then transferred by the wafer transfer apparatus 85 to the delivery unit 40 in the fourth block G4. The wafer W is then transferred by the wafer transfer apparatus 70 to the thermal treatment unit 40 and subjected to post-exposure baking treatment (Step S12 in FIG. 13). The wafer W is then transferred by the wafer transfer apparatus 70 to the developing treatment unit 33 and subjected to developing treatment (Step S13 in FIG. 13). After the development, the wafer W is transferred by the wafer transfer apparatus 70 to the thermal treatment unit 40 and subjected to post-baking treatment (Step S14 in FIG. 13).

The wafer W is then transferred by the wafer transfer apparatus 70 to the delivery unit 50 in the third block G3, and then transferred by the wafer transfer apparatus 21 in the cassette station 2 to a cassette C on a predetermined cassette mounting plate 13. Thus, a series of photolithography processes end.

According to the above embodiment, each of the cleaning unit 100 and the inspection unit 101 is provided at multiple tiers on the front side in the interface station 5 and the wafer transfer mechanism 120 is provided in a region adjacent to the cleaning units 100 and the inspection units 101, thereby making it possible to reduce the size on the back side of the interface station 5 to downsize the interface station 5 as compared to the prior art. Accordingly, it is possible to reduce the footprint of the coating and developing treatment system 1 having the function of cleaning the rear surface of the wafer W before exposure without changing the configuration of the treatment units.

Further, it is possible to access both the cleaning units 100 and the inspection units 101 from the front side of the interface station 5, thus facilitating their maintenance. Furthermore, the arrangement of no treatment unit on the back side in the interface station 5 facilitates access from the back side to the devices inside the interface station 5, thus also facilitating their maintenance.

Figure 22:
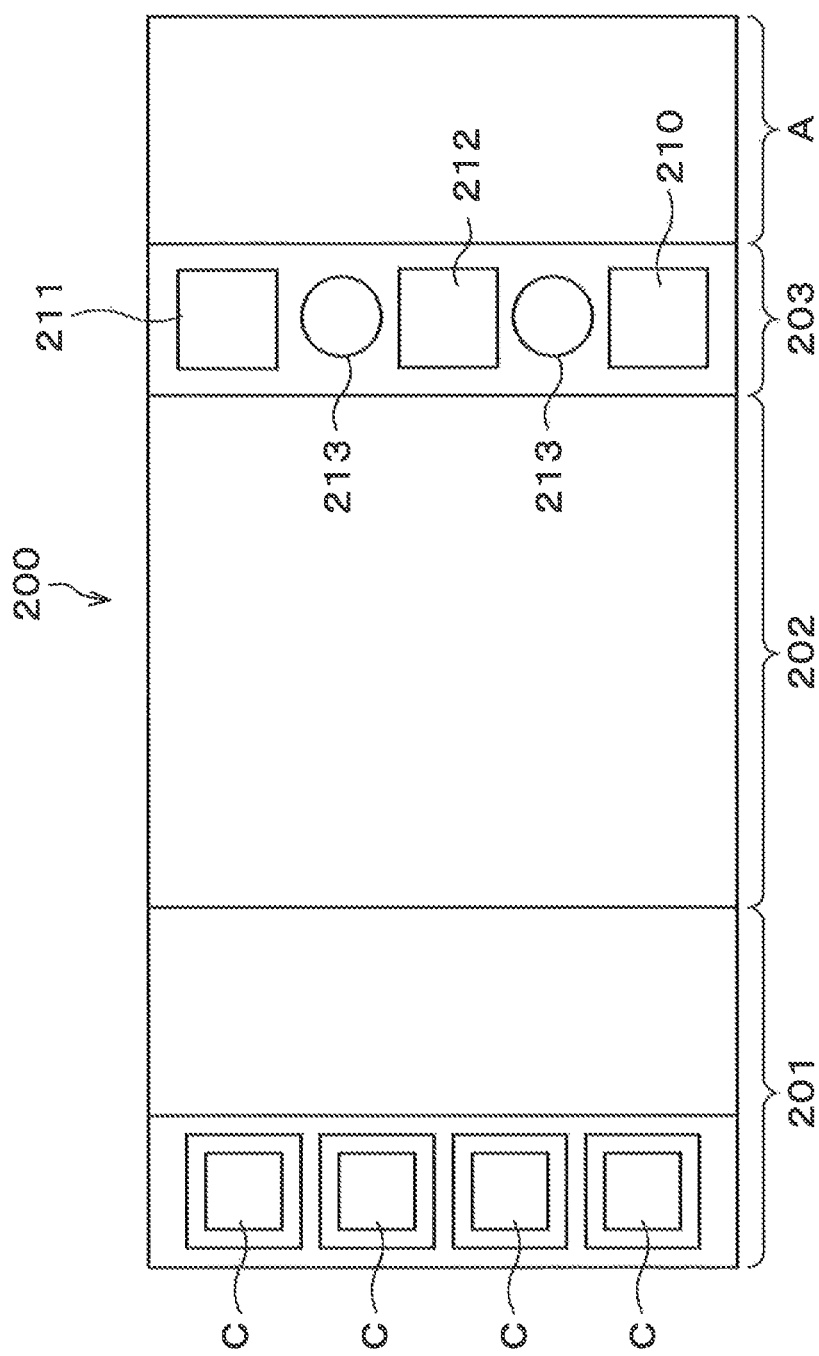
FIG. 22 is an explanatory view illustrating the outline of a configuration of a conventional coating and developing treatment system.

Further, the cleaning units 100 and the inspection units 101 are arranged at multiple tiers in the up and down direction, thereby making it possible to minimize the number of times of the cleaned wafer W coming into contact with the transfer arm. In other words, in the case where, for example, the cleaning unit 210 and the inspection unit 211 are provided separately on the front and the back as in the conventional coating and developing treatment system 200 illustrated in FIG. 22, for transferring the wafer W from the cleaning unit 210 to the inspection unit 211, it is necessary to transfer the wafer W first from the cleaning unit to the delivery unit 212 and then transfer the wafer W from the delivery unit 212 to the inspection unit 211. In this case, the rear surface of the cleaned wafer W comes into contact with a wafer transfer apparatus 214 at least two times. In contrast, the arrangement of the cleaning units 100 and the inspection units 101 in the up and down direction as in this embodiment can eliminate the necessity of passage through the delivery units 212 and therefore reduce the number of contact times between the wafer W and the transfer mechanism 120 to one. As a result, the possibility that the rear surface of the wafer W is contaminated with the particles adhering to the wafer transfer mechanism 120 can be reduced as compared to the prior art.

Further, in the above embodiment, the wafer transfer mechanism 120 has the first transfer arm 121, the second transfer arm 122, and the third transfer arm 123, and the cleaned wafer W is transferred by the transfer arms 122, 123 to the inspection unit 101 and the buffer unit 111. In this case, it is possible to suppress contamination of each transfer arm 122, 123 transferring the cleaned wafer W with particles adhering to the rear surface of the wafer W. As a result, it is possible to keep each transfer arm 122, 123 clean and to further reduce the possibility that the rear surface of the wafer W is contaminated with particles adhering to each transfer arm 122, 123 when the cleaned wafer W is transferred. Note that the third transfer arm 123 does not always need to be provided, and the transfer of the wafer W cleaned in the cleaning unit 100 to the buffer unit 111 may be performed by the second transfer arm 122.

Further, provision of the plurality of transfer arms 121, 122, 123 in the wafer transfer mechanism 120 makes it possible to even the number of steps of transfer by the transfer arms 121, 122, 123 so as to facilitate the management of the transfer time of the wafer W.

Note that the case where, for example, it is determined that the wafer W is in a state of being unexposable in the exposure apparatus 4 as a result of the inspection by the inspection unit 101 shows that the second transfer arm 122 and the third transfer arm 123 have transferred the wafer W with particles adhering to the rear surface. Then, the particles adhering to the wafer W may adhere to each transfer arm 122, 123 and contaminate the rear surface of the wafer W to be transferred next. Accordingly, when it is determined that the wafer W is in a state of being unexposable in the exposure apparatus 4 as a result of the inspection in the inspection unit 101 or becoming exposable by re-cleaning, the second transfer arm 122 and the third transfer arm 123 may be cleaned after the transfer of that wafer W. The cleaning of the transfer arms 122, 123 may be performed, for example, in the cleaning unit 100. In this case, the brush 142 in the cleaning unit 100 may be configured to be freely vertically reversed so that the upper surface of each transfer arm 122, 123 which has entered the cleaning unit 100 is cleaned with the reversed brush 142. Further, separately from the cleaning unit 100, another cleaning unit as an arm cleaning mechanism cleaning the transfer arms 122, 123 may be provided in the fifth block G5 or the sixth block G6, or a cleaning mechanism for the transfer arms 122, 123 may be provided in the buffer unit 111.

In the above embodiment, as a result of the inspection of the cleaned wafer W in the inspection unit 101, when it is determined that the wafer W is in a state of being unexposable under the existing condition but becoming exposable by re-cleaning in the cleaning unit 100, the wafer transfer control part 125 controls the wafer transfer mechanism 120 to transfer the wafer W again to the cleaning unit 100. In this case, the number of wafers W for which the subsequent treatments are stopped and which are collected into the cassette C can be reduced as compared to the conventional coating and developing treatment system 200 in which the subsequent treatments for all of the wafers W determined to be unexposable are stopped and the wafers W are collected into the cassette C. Consequently, the yield of the treatment on the wafer W by the coating and developing treatment system 1 can be improved.

Further, since the buffer unit 111 for temporarily housing the wafer W inspected in the inspection unit 101 is provided, the inspected wafer W can be kept waiting in the buffer unit 111 until the inspection result in the inspection unit 101 is available. If the wafer W is transferred without inspection result being available, a need to change the transfer destination of the wafer W during transfer may arise depending on the inspection result available afterward to greatly influence the transfer of the wafer W. However, such influence is never caused by keeping the inspected wafer W in the buffer unit 111 until the inspection result is available, because the wafer W can be transferred after decision of the transfer destination.

Note that the time period for keeping in the buffer unit 111 the wafer W inspected in the inspection unit 101 does not need to be terminated at the time when the inspection result of the wafer W is available, but the wafer W may be kept waiting for a longer time. For example, in the case where a plurality of inspected wafers W are housed in the buffer unit 111, when the inspection result of a wafer W whose inspection result is available first is the above-described "re-cleaning," the inspection result of another wafer W housed in the buffer unit 111 may be available during the process of the former wafer W being re-cleaned in the cleaning unit 100. In this case, if the next wafer W whose inspection result has been available is transferred to the exposure apparatus 4 side, the latter wafer W will be transferred to the exposure apparatus 4 passing the former wafer W to be re-cleaned. In this case, the latter wafer W will be transferred to the exposure apparatus 4 in an order different from the transfer schedule for the latter wafer W set in the treatment recipe, for example, for each lot, thus possibly causing a transfer error because the exposure apparatus 4 cannot recognize the latter wafer W.

Accordingly, when an arbitrary wafer W is determination to require "re-cleaning" as described above, it is preferable to keep the next wafer W in the buffer unit 111 until the arbitrary wafer W is inspected again in the inspection unit 101 after the re-cleaning and the inspection result of the re-cleaning is available after the arbitrary wafer W is housed in the buffer unit 111. By adjusting the time for keeping the wafer W waiting in the buffer unit 111 as described above, the wafer W can be transferred in a predetermined order even in the case of "re-cleaning." Note that the buffer unit 111 may be configured to be able to house a plurality of wafers W, for example, at multiple tiers. In this case, for example, when a wafer W in the buffer until 111 is determined to be unexposable, the wafer W is housed in the buffer unit 111 until the timing when the wafer W does not influence any longer the schedule of the wafer transfer by the wafer transfer mechanism 120, thereby making it possible to collect the wafer W without influencing the transfer schedule. It is also adoptable to keep, for example, a plurality of wafers W determined to be exposable waiting in the buffer unit 111. In this case, the exposable wafers W kept waiting are transferred to the exposure apparatus 4 during the time when the wafer W determined to require "re-cleaning" is re-cleaned, thereby ensuring the wafer W to be transferred to the exposure apparatus 4 at all times to prevent the exposure apparatus 4 from being kept waiting.

Note that the inspection units 101 are arranged below the cleaning units 100 in the above embodiment, but the cleaning units 100 may be arranged below the inspection units 101 the other way round.

Though the temperature regulation is performed on the wafer W by the temperature regulation unit 112 before the wafer W is transferred to the exposure apparatus 4 in the above embodiment, a temperature regulation mechanism regulating, for example, the temperature of the atmosphere in the inspection unit 101 to a predetermined temperature may be provided in the inspection unit 101 to perform temperature regulation on the wafer W during the time when the wafer W is being inspected in the inspection unit 101. This can reduce the treatment time in the temperature regulation unit 112 and the transfer time to the temperature regulation unit 112, thereby improving the throughput of the coating and developing treatment system 1.

The cleaning unit 100 and the inspection unit 101 are separately provided in the above embodiment, but when a plurality of units such as the cleaning unit 100 and the inspection unit 101 are provided in the interface station 5, the number of times of transferring the wafer increases because the wafer needs to be delivered between the units. As a result, the control of the wafer transfer becomes complicated, and the moving distance of the wafer transferred by the wafer transfer apparatus also increases, resulting in an increase in load on the wafer transfer apparatus.

Hence, to suppress the increase in load on the wafer transfer apparatus, the cleaning unit 100 and the inspection unit 101 may be arranged in the same casing. In a concrete example in this case, a cleaning and inspection unit 310 is used in which a wafer cleaning part 300 cleaning the rear surface of the wafer W, a wafer inspection part 301 inspecting the cleaned wafer W before the wafer W is transferred into the exposure apparatus 4, and a transfer means 302 transferring the wafer W between the wafer cleaning part 300 and the wafer inspection part 301 are housed in one casing 303 as illustrates in FIG. 14, FIG. 15. Note that the devices given the same numerals as those of the devices constituting the already-described cleaning unit 100 and inspection unit 101 in the drawings have the same configurations and therefore the description thereof will be omitted. Further, the arrangement of the cleaning and inspection unit 310 in the interface station 5 is arbitrarily set in consideration of the transfer order and the throughput of the wafer W and is thus not particularly limited.

Figure 14:
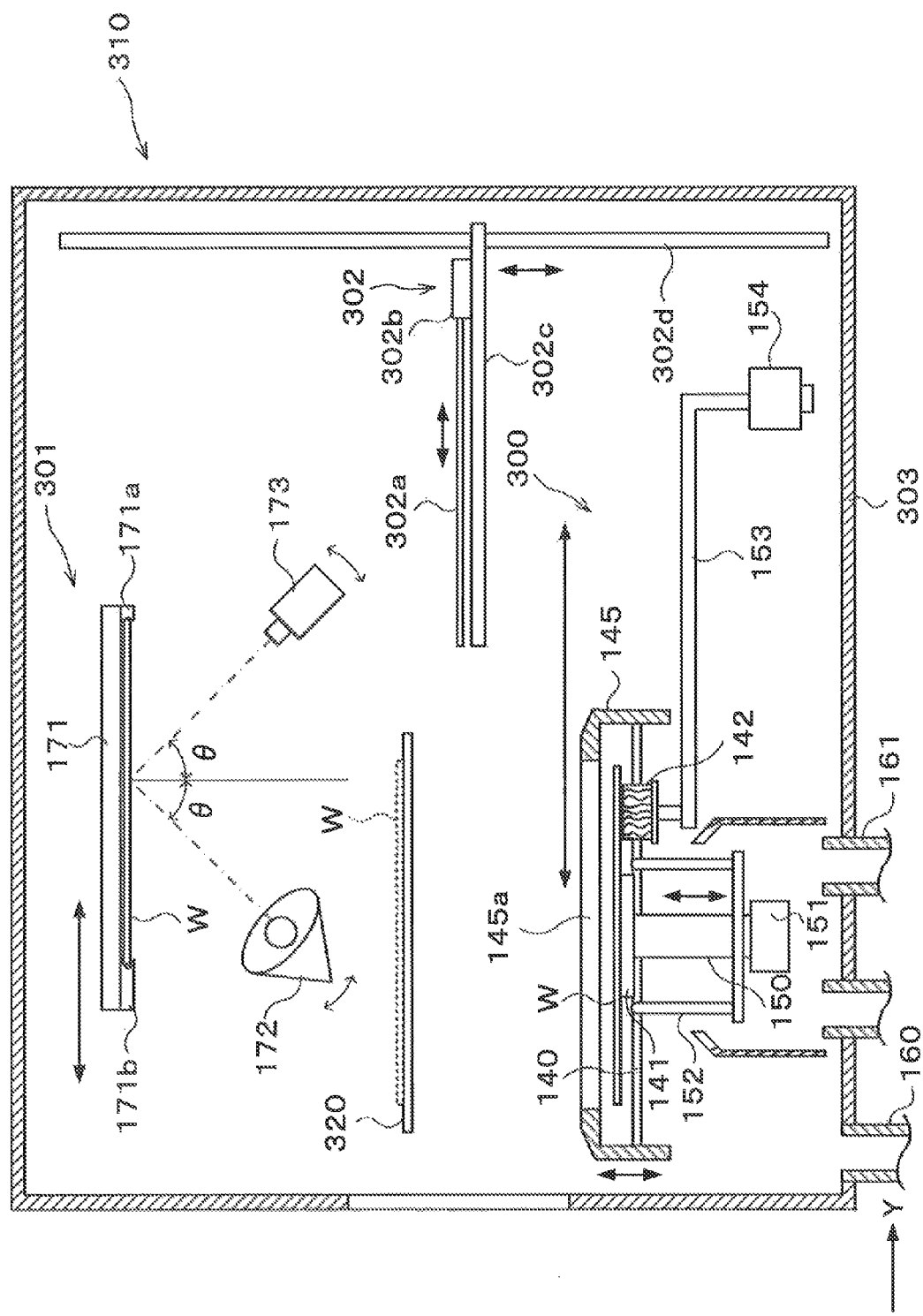
FIG. 14 is a longitudinal sectional view illustrating the outline of a configuration of a cleaning and inspection unit.

As illustrated in FIG. 14, the wafer cleaning part 300 and the wafer inspection part 301 are arranged in this order from the bottom to the top in the casing 303. In a region between the wafer cleaning part 300 and the wafer inspection part 301, namely, above the wafer cleaning part 300 and below the wafer inspection part 301, a waiting and mounting table 320 is arranged which temporarily keeps the wafer W inspected at the wafer inspection part 301 waiting thereon.

Figure 15:
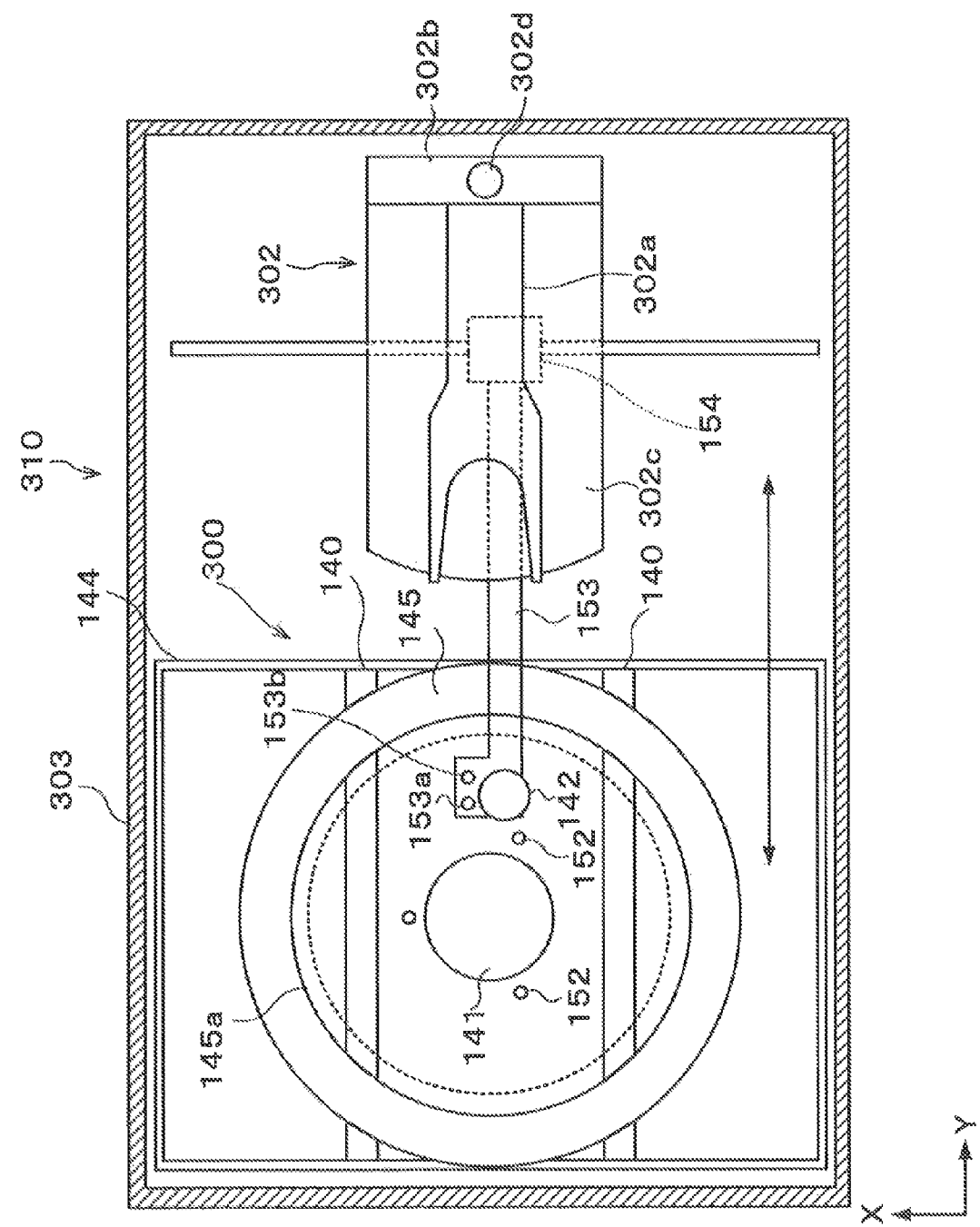
FIG. 15 is a transverse sectional view illustrating the outline of the configuration in the vicinity of a wafer cleaning part of the cleaning and inspection unit.

The transfer means 302 includes a transfer arm 302a in an almost U-shape having a tip branched off into two parts as illustrated in FIG. 15. At the end of the transfer arm 302a, an arm drive mechanism 302b moving the transfer arm 302a in the forward and backward direction is provided. The arm drive mechanism 302b is supported by a base 302c.

In the base 302c, a drive mechanism (not illustrated) is built which freely moves the base 302c in the θ-direction and the up and down direction along a raising and lowering rail 302d provided to extend in the vertical direction. Thus, the transfer arm 302a is configured to be movable in the forward and backward direction, the θ-direction, and the up and down direction and can move up and down while holding the wafer W to transfer the wafer W between the wafer cleaning part 300 and the wafer inspection part 301.

The waiting and mounting table 320 has raising and lowering pins (not illustrated) built therein and can deliver the wafer W through use of the raising and lowering pins to/from the transfer arm 302a and each transfer arm in the interface station 5.

Figure 16:
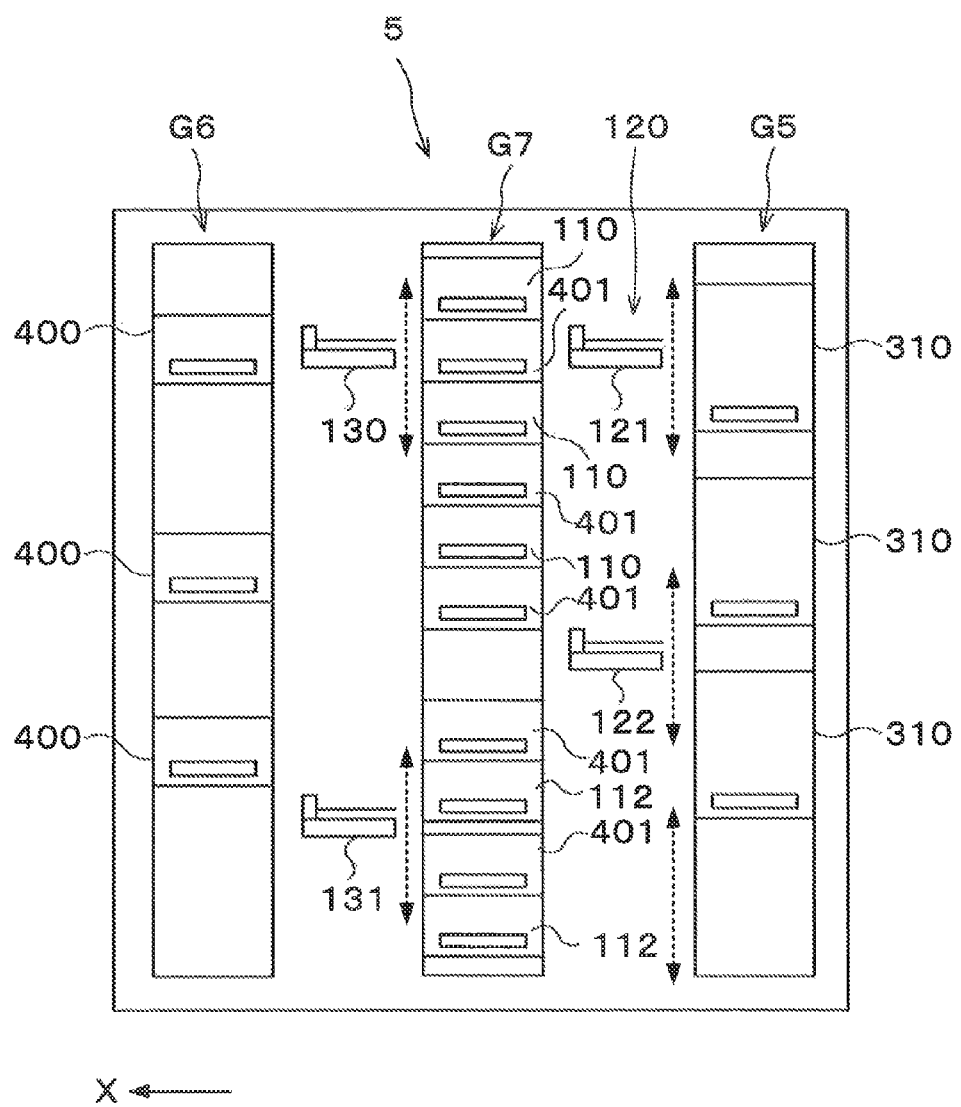
FIG. 16 is an explanatory view illustrating the outline of a configuration of an interface station according to another embodiment.

Further, since moisture adheres to the wafer W which has been cleaned in the cleaning unit 100, a dehydration unit removing the adhering moisture may be provided in the interface station 5. In one proposed example of the device arrangement in this case, three blocks G5, G6, G7 including various kinds of units can be provided in the interface station 5, for example, as illustrated in FIG. 16. The fifth block G5 is provided on the front side (an X-direction negative direction side in FIG. 1) in the interface station 5. The sixth block G6 is provided on the back side (an X-direction positive direction side in FIG. 1) in the interface station 5. Further, the seventh block G7 is provided in a region between the fifth block G5 and the sixth block G6.

For example, in the fifth block G5, three cleaning and inspection units 310 are arranged, for example, in the up and down direction as illustrated in FIG. 16.

In the sixth block G6, three dehydration units 400 each dehydrating the moisture adhering to the wafer W which has been cleaned and inspected in the cleaning and inspection unit 310 are arranged, for example, in the up and down direction.

In the seventh block G7, a plurality of delivery units 110, delivery units 401 each for delivering the wafer W which has been cleaned and inspected in the cleaning and inspection unit 310 to the dehydration unit 400 and the exposure apparatus 4, and temperature regulation units 402 as temperature regulation mechanisms each regulating the temperature of the wafer W after dehydration to a predetermined temperature before it is transferred into the exposure apparatus 4, are provided in the up and down direction.

Figure 17:
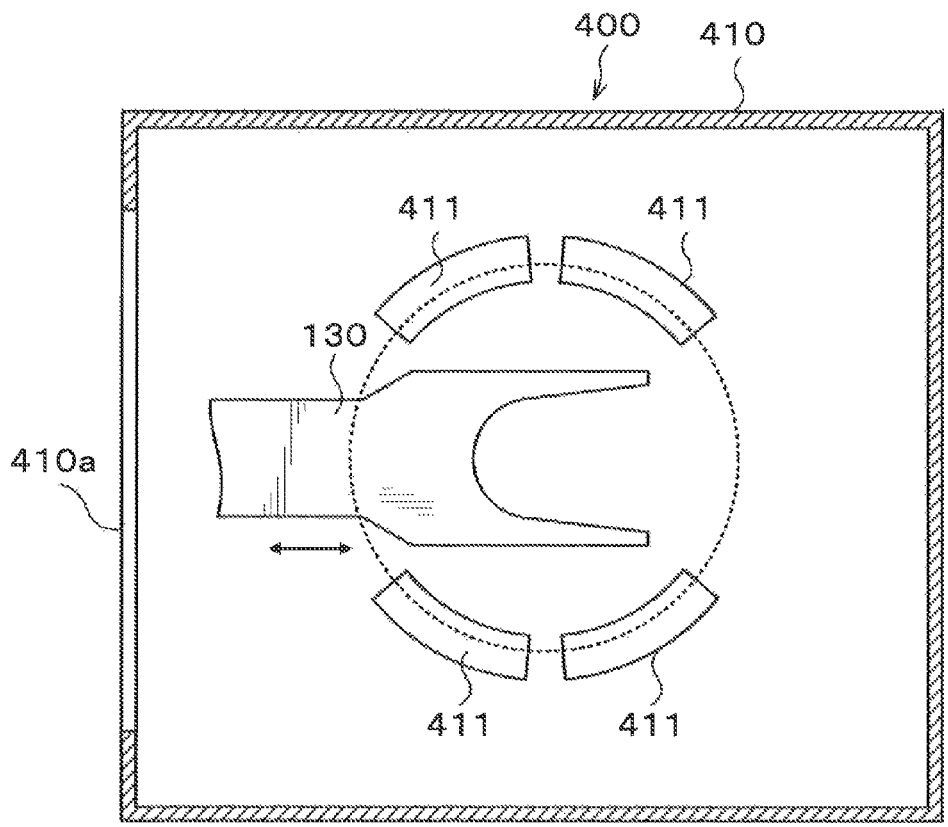
FIG. 17 is a plan view illustrating the outline of a configuration of a dehydration unit.
Figure 18:
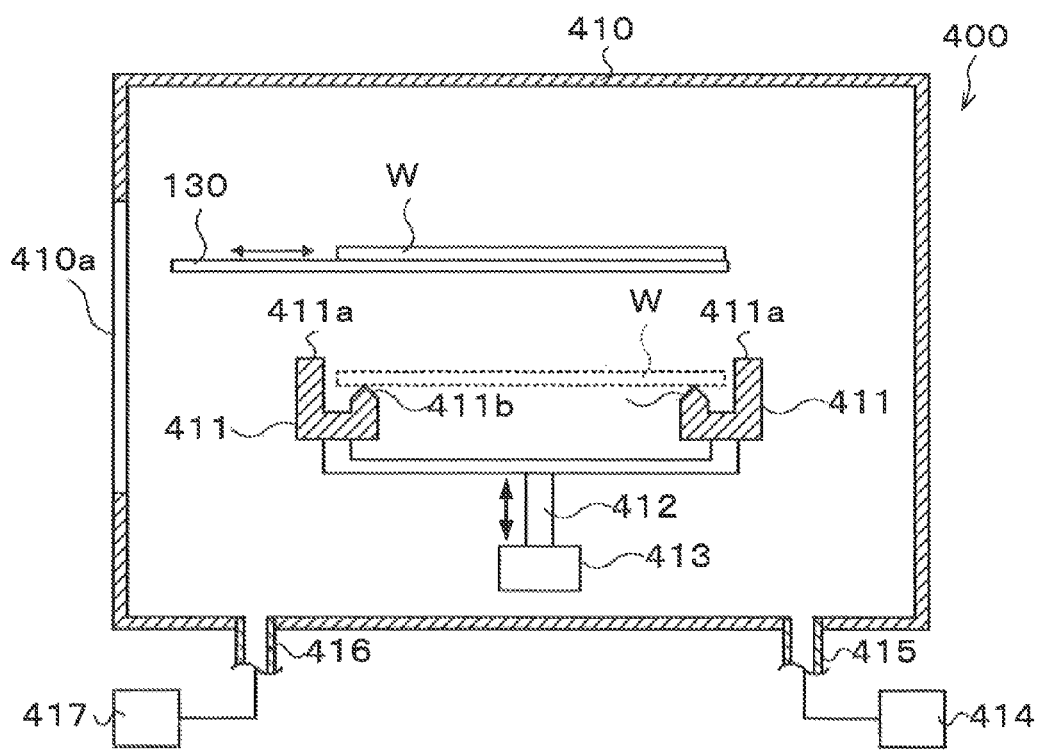
FIG. 18 is a longitudinal sectional view illustrating the outline of the configuration of the dehydration unit.

The configuration of the dehydration unit will be described. FIG. 17 is a plan view illustrating the outline of the configuration of the dehydration unit 400, and FIG. 18 is a longitudinal sectional view illustrating the outline of the configuration of the dehydration unit 400.

The dehydration unit 400 has a treatment container 410 in which dehydration treatment is performed on the wafer W, holding members 411 holding the outer peripheral portion of the rear surface of the wafer W, and a raising and lowering mechanism 413 raising and lowering the holding member 411 in the up and down direction via a shaft 412.

A plurality of, four in this embodiment, holding members 411 are each concentrically formed in an almost arc shape in a plan view as illustrated, for example, in FIG. 17. The holding member 411 has a cross-sectional shape in an almost U-shape as illustrated in FIG. 18 such that an upper end part 411a on the outer peripheral side is formed to be higher than an upper end part 411b on the inner peripheral side. Thus, a part of the holding member 411 on the outer peripheral side functions as a guide preventing the wafer W from falling off when the wafer W is held by the upper end part 411b on the inner peripheral side.

For delivery of the wafer W between each holding member 411 and the wafer transfer mechanism 120, the transfer arm 130a enters through a shutter 410a of the treatment container 410, for example, as illustrated in FIG. 17. Subsequently, the transfer arm 130a is moved so that the center part of the wafer W held by the transfer arm 130a is aligned with the center of the arcs formed by the plurality of holding members 411. Then, in this state, the raising and lowering mechanism 413 raises the holding members 411. Thereby, the wafer W is delivered from the transfer arm 130a to the holding members 411. Thereafter, the transfer arm 130a is retracted to the outside of the treatment container 410. Note that the delivery of the wafer W between the transfer arm 130a and the holding members 411 may be performed, for example, by raising and lowering the transfer arm 130a instead of raising and lowering the holding members 411.

At the bottom of the treatment container 410, an exhaust pipe 415 connected to an exhaust mechanism 414 and a purge pipe 416 purging the inside of the treatment container 410 by feeding, for example, a nitrogen gas into the treatment container 410 are provided. To the purge pipe 416, a gas supply source 417 supplying the nitrogen gas is connected.

For performing the dehydration treatment on the wafer W in the dehydration unit 400, the wafer W is first transferred by the transfer arm 130a into the treatment container 410, and the wafer W is then delivered to the holding members 411. Thereafter, the transfer arm 130a is retracted to the outside of the treatment container 410, and the shutter 410a is closed. Subsequently, the exhaust mechanism 414 reduces the pressure inside the treatment container 410. This vaporizes the moisture adhering to the wafer W and thereby performs the dehydration treatment on the wafer W.

After the dehydration treatment on the wafer W is finished, purge and increase in pressure inside the treatment container 410 are performed through the purge pipe 416. Thereafter, the shutter 410a is opened, and the wafer W is transferred out of the dehydration unit 400 by the transfer arm 130a.

Figure 19:
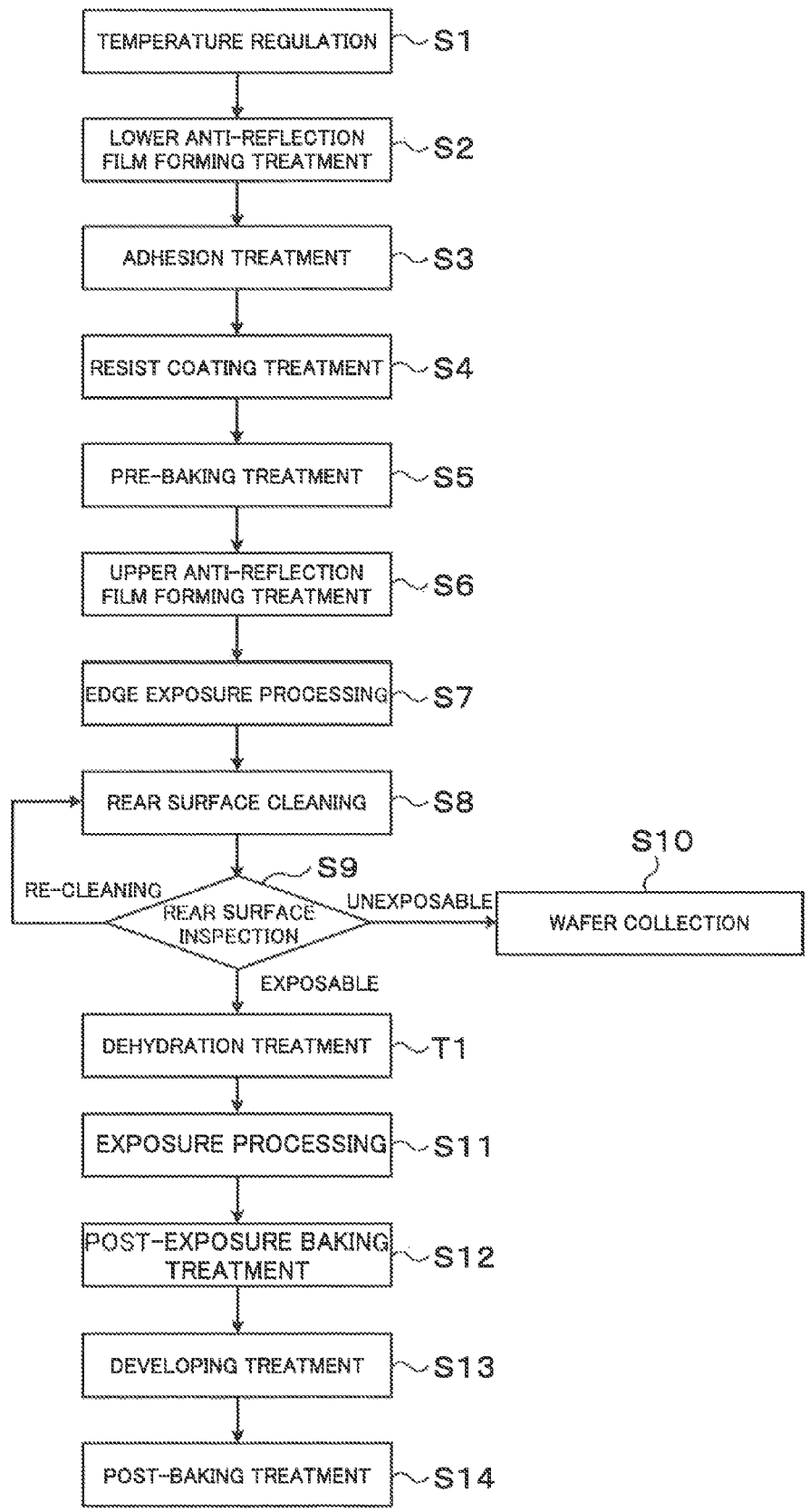
FIG. 19 is a flowchart illustrating main steps in another example of wafer treatment performed in the coating and developing treatment system.

Next, the treatment on the substrate in the coating and developing treatment system 1 including the cleaning and inspection units 310 and the dehydration units 400 will be described together with a flowchart illustrated in FIG. 19.

After the edge exposure processing is finished at Step S7, the wafer W is transferred to the cleaning and inspection unit 310. In the cleaning and inspection unit 310, the cleaning of the rear surface of the wafer W and the spin-drying of the cleaning solution are performed first at the wafer cleaning part 300 (Step S8 in FIG. 19). After the spin-drying is finished, the wafer W is delivered to the transfer arm 302a. Then, the transfer arm 302a is raised while holding the wafer W up to the wafer inspection part 301 and moved to below the holding arm 171. Then, the wafer W is sandwiched between the locking part 171a and the movable holding part 171b of the holding arm 171 and thereby delivered to the holding arm 171, and subjected to inspection at the wafer inspection part 301 (Step S9 in FIG. 19).

After the inspection is finished, the wafer W is delivered again to the transfer means 302 and then delivered to the waiting and mounting table 320. In parallel with that, the control unit 6 determines which of three kinds of states the state of the wafer W belongs to: a state of being exposable in the exposure apparatus 4; a state of being unexposable in the exposure apparatus 4; and a state of being unexposable in the exposure apparatus 4 under the existing condition but becoming exposable in the exposure apparatus 4 by re-cleaning at the wafer cleaning part 141.

As a result of the inspection at the wafer inspection part 301, when it is determined that the wafer W is in a state of being exposable in the exposure apparatus 4, the wafer W on the waiting and mounting table 320 is transferred out of the cleaning and inspection unit 310 and transferred to the dehydration unit 102. Further, also when it is determined that the wafer W is in a state of being unexposable, the wafer W is transferred out of the cleaning and inspection unit 310 and the subsequent treatments on the wafer W are stopped and the wafer W is collected into the cassette (Step S10 in FIG. 19).

When the inspection result of the wafer W is "re-cleaning," the wafer W on the waiting and mounting table 320 is transferred by the transfer means 302 again to the wafer cleaning part 300. The wafer W transferred again to the wafer cleaning part 300 is subjected again to the above-described cleaning and inspection, and the re-cleaned and re-inspected wafer W is transferred out of the cleaning and inspection unit 310 and dehydrated in the dehydration unit 102 (Step Ti in FIG. 19). The subsequent steps S11 to S14 are the same as those in the above-described embodiment and therefore the description thereof will be omitted.

According to this embodiment, the wafer cleaning part 300 cleaning the rear surface of the wafer W and the wafer inspection part 301 inspecting the cleaned wafer W are housed in the same casing 303, and the transfer of the wafer W between the wafer cleaning part 300 and the wafer inspection part 301 can be performed by the transfer means 302 provided inside the casing 303. Therefore, for transferring the wafer W between the wafer cleaning part 300 and the wafer inspection part 301, it becomes unnecessary to use the wafer transfer apparatus provided, for example, outside the casing 303, namely, in the interface station 5 as in the prior art. As a result, the wafer transfer distance in the coating and developing treatment system 1 can be reduced and the load on the wafer transfer apparatus in the interface station 5 can be reduced.

Further, since the transfer of the wafer W accompanying the re-cleaning at the wafer cleaning part 300 is performed by the transfer means 302, the load on the wafer transfer apparatus outside the casing 303 is never increased in the re-cleaning. Note that the wafer inspection part 301 is arranged above the wafer cleaning part 300 in the above embodiment, but the wafer cleaning part 300 may be arranged above the wafer inspection part 301 the other way round.

Further, the transfer arms are selectively used for the wafer W determined to be unexposable in the exposure apparatus 4 and the wafer W determined to be exposable among the wafers W which have been subjected to the cleaning and inspection. In this case, it is possible to prevent a clean transfer arm from being contaminated with particles adhering to the wafer W determined to be unexposable. Consequently, the transfer arms and the units used in the downstream steps can be kept clean.

Note that it is determined that the wafer W is in a state of being unexposable or requiring re-cleaning as a result of the inspection at the wafer inspection part 301, the transfer means 302 may be cleaned at the wafer cleaning part 300 after transferring the wafer W.

Further, the dehydration unit 400 may be provided inside the cleaning and inspection unit 310. In this case, for example, the dehydration unit 400 is arranged inside the casing 303 in place of the waiting and mounting table 320. It is preferable to transfer, after the inspection at the wafer inspection part 301, the wafer W to the dehydration unit 400 and to perform dehydration treatment on the wafer W. This makes it possible to perform the dehydration treatment in parallel while waiting for the inspection result of the wafer W, thus improving the throughput of the wafer W.

Figure 20:
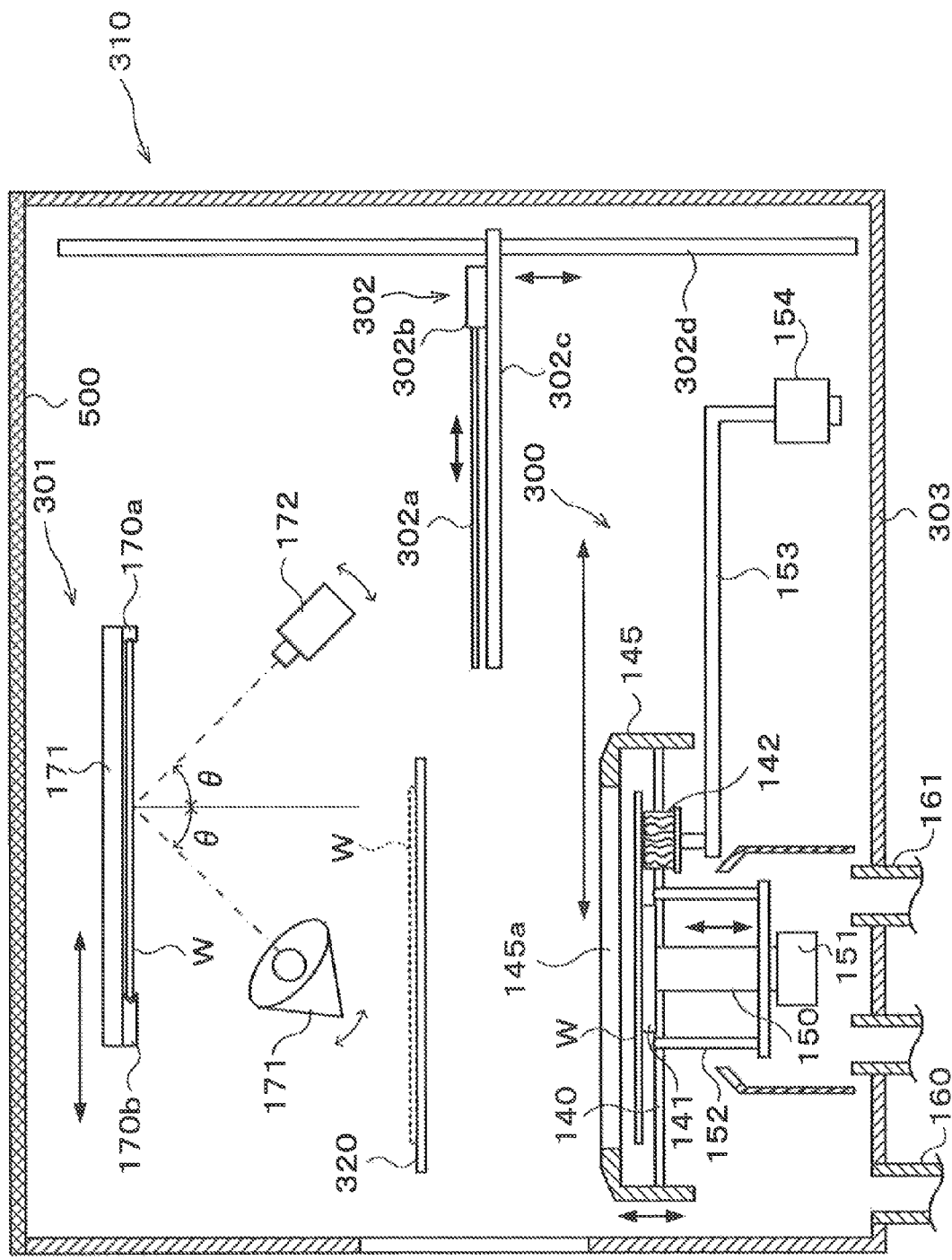
FIG. 20 is a longitudinal sectional view illustrating the outline of a configuration of a cleaning and inspection unit.

Further, the temperature regulation performed in the temperature regulation unit 112 in the above embodiment may be performed, for example, inside the cleaning and inspection unit 310. In this case, a cooling mechanism 500 cooling, for example, the air inside the casing 303 is provided at a ceiling part of the casing 303 of the cleaning and inspection unit 310 as illustrated, for example, in FIG. 20, and the cooling mechanism 500 regulates the temperature of the atmosphere inside the casing 303 to a predetermined temperature and thereby performs temperature regulation of the wafer W. For the cooling mechanism 500, a radiator through which coolant at a predetermined temperature flows can be used. This enables temperature regulation of the wafer W during the time when the wafer W is kept waiting on the waiting and mounting table 320 after the inspection of the wafer W is finished. Consequently, the time required for the temperature regulation of the wafer W can be reduced and the transfer to the temperature regulation unit 112 becomes unnecessary, thus improving the throughput in the coating and developing treatment system 1. Further, the temperature regulation unit 112 itself becomes unnecessary, leading to downsizing of the interface station 5.

Figure 21:
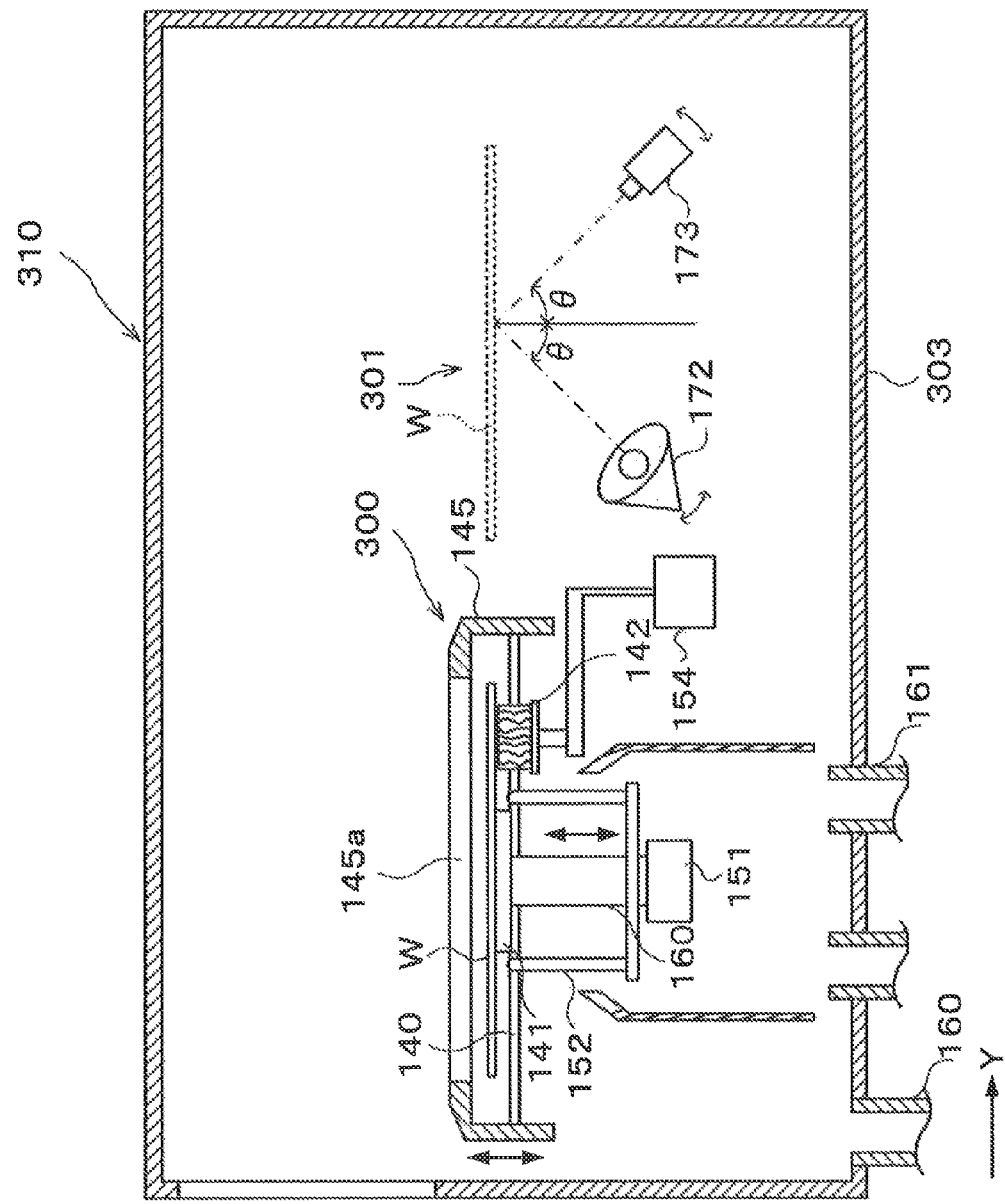
FIG. 21 is a longitudinal sectional view illustrating the outline of a configuration of a cleaning and inspection unit.

Note that though the wafer cleaning part 300 and the wafer inspection part 301 are arranged in the up and down direction in the casing 303 of the cleaning and inspection unit 310 in the above embodiment, the arrangement of the wafer cleaning part 300 and the wafer inspection part 301 is not limited to that in this embodiment. For example, as illustrated in FIG. 21, the wafer cleaning part 300 and the wafer inspection part 302 may be arranged in the horizontal direction. In this case, the transfer of the wafer W between the wafer cleaning part 300 and the wafer inspection part 301 may be performed by moving the frame body 144, for example, with the wafer W held on the suction pads 140 of the wafer cleaning part 300. Then, the rear surface of the wafer W held on the suction pads 140 is inspected by the light source 172 and the camera 173.

Further, the wafer W may be held on the suction pads 140, for example, until the inspection result of the rear surface of the wafer W is available. This eliminates the need to transfer the wafer W to the waiting and mounting table 320 and therefore eliminates the necessity of not only the waiting and mounting table 320 but also the transfer means 302. In the re-cleaning, the wafer W held on the suction pads 140 is moved to the wafer cleaning part 300, and after the cleaning, the wafer W held on the suction pads 140 is moved again to the wafer inspection part 301. Further, when the wafer W is determined to be exposable or unexposable, the wafer W is delivered to the raising and lowering pins 152 of the wafer cleaning part 300 and transferred out of the cleaning and inspection unit 310 by the wafer transfer mechanism 120. In this case, the suction pads 140 supported on the frame body 144 serve as the transfer means of this embodiment.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but may take various forms. The present invention is also applicable to the case where the substrate is a substrate other than the wafer, such as an FPD (Flat Panel Display), a mask reticle for a photomask or the like.

What is claimed is:

1. A substrate treatment system comprising a treatment station in which a plurality of treatment units each treating a substrate, and an interface station in a casing which is located between said treatment station and an exposure apparatus, the interface station delivering the substrate between said treatment station and an exposure apparatus provided outside the casing, said interface station comprising:
a cleaning unit that cleans at least a rear surface of the substrate;
an inspection unit that inspects at least the rear surface of the cleaned substrate;
a substrate transfer mechanism including an arm that transfers the substrate between said cleaning unit and said inspection unit;
a buffer housing part that temporarily houses the substrate which has been inspected in said inspection unit; and
a substrate transfer control part, the substrate transfer control part is configured to
control the cleaning unit to clean at least the rear surface of the substrate,
control the substrate transfer mechanism to transfer the substrate from said cleaning unit into said inspection unit;
control the inspection unit to inspect at least the rear surface of the cleaned substrate transferred from the cleaning unit, to determine from a result of the inspection by the inspection unit whether the substrate is in an exposable state that allows exposure in the exposure apparatus, and when it is determined that the substrate is not in the exposable state to determine from the result of the inspection whether the substrate becomes the exposable state by re-cleaning;
control the substrate transfer mechanism to transfer the substrate which is inspected to the buffer housing part before transferring the substrate based on the result of the inspection by the inspection unit;
when it is determined from the result of the inspection that the state of the substrate is in the exposable state, control said substrate transfer mechanism to transfer the substrate to the exposure apparatus,
when it is determined from the result of the inspection that the state of the substrate becomes the exposable state by re-cleaning, control said substrate transfer mechanism to transfer the substrate again to said cleaning unit and control the cleaning unit to re-clean at least the rear surface of the substrate,
when it is determined from the result of the inspection that the state of the substrate does not become the exposable state by re-cleaning, stop the treatments on the substrate, and control the substrate transfer mechanism to facilitate collecting the substrate;
the cleaning unit, the inspection unit, and the buffer housing part are arranged in the same casing which is located between the treatment stations and the exposure apparatus,
wherein each of said cleaning unit and said inspection unit is provided at multiple tiers in an up and down direction on either a front side or a back side in said interface station, and
wherein said substrate transfer mechanism is provided in a region adjacent to said cleaning units and said inspection units provided at multiple tiers in the up and down direction.

2. The substrate treatment system as set forth in claim 1, wherein said substrate transfer control part is further configured to control said substrate transfer mechanism to transfer the substrate which has been transferred again to said cleaning unit and cleaned therein, again to said inspection unit.

3. The substrate treatment system as set forth in claim 1, wherein said substrate transfer mechanism includes a first transfer arm and a second transfer arm, the substrate transfer control part is configured to control the first transfer arm to transfer the substrate in said interface station to said cleaning unit, and to control the second transfer arm to transfer the substrate which has been cleaned in said cleaning unit to said inspection unit and to the substrate which has been inspected in said inspection unit to said buffer housing part.

4. The substrate treatment system as set forth in claim 1, wherein said substrate transfer mechanism includes a first transfer arm, a second transfer arm, and a third transfer arm, the substrate transfer control part is configured to control the first transfer arm to transfer the substrate transferred in said interface station to said cleaning unit, to control the second transfer arm to transfer the substrate which has been cleaned in said cleaning unit to said inspection unit, and to control the third transfer arm to transfer the substrate which has been inspected in said inspection unit to said buffer housing part.

5. The substrate treatment system as set forth in claim 1, wherein the substrate transfer control part waits to control a transfer of the substrate from said buffer housing part while said buffer housing part houses the inspected substrate until an inspection result of the inspected substrate is available.

6. The substrate treatment system as set forth in claim 1, further comprising an arm cleaning mechanism provided on a side where said cleaning units and said inspection units are arranged in said interface station,
wherein the substrate transfer control part is further configured to control the cleaning mechanism to clean the transfer arm of said substrate transfer mechanism.

7. The substrate treatment system as set forth in claim 6, wherein said cleaning unit also serves as said arm cleaning mechanism.

8. The substrate treatment system as set forth in claim 1, further comprising:
a temperature regulation mechanism regulating a temperature of the substrate which has been inspected in said inspection unit and will be transferred into said exposure apparatus, to a predetermined temperature.

9. The substrate treatment system as set forth in claim 8, wherein said temperature regulation mechanism is provided in said inspection unit.

* * * * *